(12) United States Patent
Harakawa

(10) Patent No.: US 6,505,090 B1
(45) Date of Patent: Jan. 7, 2003

(54) SEMICONDUCTOR DEVICE MANUFACTURING METHOD, MANUFACTURING SYSTEM, SUPPORT SYSTEM AND RECORDING MEDIUM STORING PROGRAM OF AND DATA FOR THE MANUFACTURE METHOD

(75) Inventor: Shoichi Harakawa, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/460,415

(22) Filed: Dec. 14, 1999

(30) Foreign Application Priority Data

Dec. 15, 1998 (JP) ............................. 10-356713

(51) Int. Cl.⁷ .................. G06F 19/00; H01L 21/00; G01C 25/00; G05D 3/00
(52) U.S. Cl. ................ 700/121; 700/109; 700/303; 702/97; 438/5
(58) Field of Search .................. 700/108, 117–119, 700/121, 123, 303, 32–33, 109; 702/97, 155, 158, 166, 170; 438/5, 10, 13, 15

(56) References Cited

U.S. PATENT DOCUMENTS

| | | | |
|---|---|---|---|
| 4,571,685 A | | 2/1986 | Kamoshida |
| 4,901,242 A | * | 2/1990 | Kotan .................. 700/108 |
| 5,893,050 A | * | 4/1999 | Park et al. .............. 702/97 |
| 6,098,024 A | * | 8/2000 | Chen et al. ............. 702/81 |
| 6,230,069 B1 | * | 5/2001 | Campbell et al. ....... 700/121 |
| 6,263,255 B1 | * | 7/2001 | Tan et al. .............. 700/121 |
| 6,444,481 B1 | * | 9/2002 | Pasadyn et al. ........... 438/5 |

OTHER PUBLICATIONS

E. Fukuda, et al., Conference Proceedings of ISSM '99, pps. 321–324, "Advanced Process Control System Description of an Easy–To–Use Control System Incorporating Pluggable Modules", Oct. 11–13, 1999.

* cited by examiner

Primary Examiner—Leo Picard
Assistant Examiner—Ryan Jarrett
(74) Attorney, Agent, or Firm—Oblon, Spivak, McClelland, Maier & Neustadt, P.C.

(57) ABSTRACT

Semiconductor device manufacturing method for processing condition described as function of metrology process name, and performing semiconductor device measurement, generating new processing condition by linking the measurement result with the processing condition, and manufacturing the semiconductor device itself under the new processing condition is provided. Moreover, manufacturing support system for assisting this manufacturing method, a manufacturing system for execution, and further, a recording medium wherein a program and data for executing this manufacturing method are stored are provided.

20 Claims, 25 Drawing Sheets

FIG.13

| PROCESS NAME | PROCESSING CONDITIONS |
|---|---|
| MANUFACTURING PROCESS A | CONDITION a1 |
|  | CONDITION a2 |
| METROLOGY PROCESS B |  |
| MANUFACTURING PROCESS C | CONDITION c1 |
|  | CONDITION c2 |
|  | CONDITION c3 |
| METROLOGY PROCESS D |  |
| MANUFACTURING PROCESS E | 43   CONDITION e1 = FUNCTION(PROCESS B, PROCESS D) |
|  | CONDITION e2 |

| PROCESS NAME | PROCESSING CONDITIONS AND DATA LABEL |
|---|---|
| MANUFACTURING PROCESS A | CONDITION a1 |
|  | CONDITION a2 |
| METROLOGY PROCESS B | DATA LABEL b1 |
| MANUFACTURING PROCESS C | CONDITION c1 |
|  | CONDITION c2 |
|  | CONDITION c3 |
| METROLOGY PROCESS D | DATA LABEL d1 |
| MANUFACTURING PROCESS E | CONDITION e1 =FUNCTION (b1, d1) |
|  | CONDITION e2 |

41     42     44 (bracket on Process E conditions)

FIG.15

| PROCESS NUMBER | PROCESS NAME | PROCESSING CONDITIONS |
|---|---|---|
| n+1 | MANUFACTURING PROCESS A | CONDITION a1 |
| | | CONDITION a2 |
| n+2 | METROLOGY PROCESS B | |
| n+3 | MANUFACTURING PROCESS C | CONDITION c1 |
| | | CONDITION c2 |
| | | CONDITION c3 |
| n+4 | METROLOGY PROCESS D | |
| n+5 | MANUFACTURING PROCESS E | CONDITION e1 =FUNCTION (n+2,n+4) {45} |
| | | CONDITION e2 |

| PROCESS NAME | PROCESSING CONDITIONS AND DATA LABEL |
|---|---|
| FIRST DEPOSITION PROCESS | FILM TYPE=A |
| | THICKNESS=300nm±10% |
| FIRST METRTOLOGY PROCESS | X |
| SECOND DEPOSITION PROCESS | FILM TYPE=B |
| | THICKNESS=600nm±10% |
| SECOND METRTOLOGY PROCESS | Y |
| ETCHING PROCESS | ETCHING DEPTH =(X+Y)×110%  —46 |

| PROCESS NUMBER | PROCESS NAME | PROCESSING CONDITIONS |
|---|---|---|
| N201 | FIRST DEPOSITION PROCESS | FILM TYPE=C |
| | | THICKNESS=1000nm ±10% |
| N202 | POLISHING PROCESS | UNREMOVAL THICKNESS =500nm ±10% |
| N203 | METROLOGY PROCESS | |
| N204 | SECOND DEPOSITION PROCESS | FILM TYPE=C |
| | | THICKNESS=1000-N203(nm) — 47 |

40　　41　　42

SEMICONDUCTOR DEVICE MANUFACTURING METHOD, MANUFACTURING SYSTEM, SUPPORT SYSTEM AND RECORDING MEDIUM STORING PROGRAM OF AND DATA FOR THE MANUFACTURE METHOD

CROSS REFERENCE TO RELATED APPLICATIONS

The subject application is related to subject matter disclosed in the Japanese Patent Application No.Hei 10-356713 filed in Dec. 15, 1998 in Japan, to which the subject application claims priority under the Paris Convention and which is incorporation by reference herein.

BACKGROUND OF THE INVENTION

1. Field of the Invention

The present invention relates to a manufacturing technology of electronic devices such as semiconductor device and, more particularly, a manufacturing method of electronic devices, a control system for supporting this manufacturing, a manufacturing system for manufacturing, and a recording medium where programs for realizing the manufacturing method and a recording medium where data used for the manufacturing method are stored.

2. Description of the Related Art

In the manufacturing method of semiconductor devices, semiconductor substrates, typically silicon wafers, are used and semiconductor elements are integrated and formed on the semiconductor substrates by performing a series of processes of deposition, lithography, etching or the like. According to the demand of higher integration degree of these semiconductor elements to be integrated and formed, respective elements are required to be further miniaturized. Consequently, the designing dimensional tolerance range allowed for manufacturing semiconductor becomes all the more strict.

In respective processes during the manufacturing, the manufacturing is so performed to obtain dimensions within the processing condition range of the semiconductor device manufacturing equipment that can be controlled (called "control range" hereinafter). However, in some cases, the manufacturing may become impossible in the following process by the accumulation of processing errors in the previous processes, even when the process errors of respective process or the control range reflects effectively the specification of the semiconductor device manufacturing equipment.

As a first conventional example, a processing flow shall be described for a semiconductor device comprising an A-type-film and a B-type-film as interlayer dielectric film film and a contact hole, as shown in FIG. 1. Here, the "processing flow" means a flow chart wherein a plurality of manufacturing process name and metrology process name are arranged in the manufacturing order of a semiconductor device. And, metrology criteria or the like may be added for each metrology process name, even when processing conditions are added to each manufacturing process. In this processing flow, a step S41 which is a first deposition process for depositing an A-type-film, a step S42 which is a first metrology process for measuring the thickness of the A-type-film, a step S43 which is a second deposition process for depositing a B-type-film, a step S44 which is a second metrology process for measuring the thickness of the B-type-film, and a step S45 which is an etching process for forming a contact hole by etching the A-type-film and the B-type-film are performed in this order. FIG. 2A shows the cross-section of the semiconductor device after the processing.

In the flow chart shown in FIG. 1, the processing condition of the first deposition process consists in depositing the A-type-film (boro-phosphate-silicate-glass (BPSG) film, or the like) of 300 nm in thickness within the control range of +/−10%. Then, in the step S41, the first deposition process is performed so as to fulfill this condition and a A-type-film 112 of FIG. 2A is deposited on a substrate 101. Next, in the step S42, the thickness is measured by the first metrology process for measuring the result of this deposition. If the measured value is within the control range, the flow advances to the next step S43, but if it is out of the control range, the flow can not go ahead to the next step, as the deposition is defective.

The processing condition of the second deposition process consists in depositing the B-type-film (non-doped-silicate-glass (NSG) film, or the like) of 600 nm in thickness within the control range of +/−10%. Then, in the step S43, the second deposition process is performed so as to fulfill this condition and a B-type-film 113 of FIG. 2A is deposited. Next, in the step S44, the thickness is measured by the second metrology process for measuring the result of this deposition. If the measured value is within the control range, the flow advances to the next step S45, but if it is out of the control range, the flow can not go ahead to the next step, as the deposition is defective.

At last, the processing condition of the etching process is decided to eliminate completely the A-type-film 112 and the B-type-film 113 as shown in FIG. 2A. The etching depth is so decided not to leave, even when the etching depth be minimum, any film 112, 113 of the thickness which can be maximum respectively in the first deposition process and the second deposition process.

In this case, the maximum thickness will be 990 nm, sum of 300 nm, thickness of the A-type-film, and 600 nm, thickness of the B-type-film, increased by 10%. The etching depth is set to 1100 nm not to leave any film of 990 nm in maximum thickness even when the etching depth has decreased by 10% with in the control range. The etching process is performed in the step S45 to fulfill this condition, and a contact hole 134 of FIG. 2A is formed.

In this situation, as shown in FIG. 2B, the thickness of the A-type-film 122 and the B-type-film 123 may become minimum, and the etching depth may become maximum within the control range. In this case, the minimum thickness will be 810 nm, sum of 300 nm, thickness of the A-type-film, and 600 nm, thickness of the B-type-film, decreased by 10%, while the etching amount will be 1210 nm, that is 1100 nm increased by 10%. The over-etching amount of the A-type-film 122 and the B-type-film 123 after etching will be 400 nm, converted into the etching depth of the A-type-film and the B-type-film, the over-etching proportion attaining 49%. If over-etched, it is the substrate that will be etched. As the substrate etching rate decreases to about for example 10% of the rate of the A-type-film and the B-type-film, the over-etch depth will be 40 nm.

As a second conventional example, a processing flow of a semiconductor device comprising an interlayer dielectric film formed by planarizing a graduated film and depositing a film thereon will now be described referring to a flow chart shown in FIG. 3. In this processing flow, a step S51 which is a first deposition process for depositing a C-type-film, a step S52 which is a first metrology process for measuring the thickness of the C-type-film, a step S53 which is a polishing process for polishing the C-type-film, a step S54 which is a second metrology process for measuring the thickness of the C-type-film, and a step S55 which is a second deposition process for depositing the C-type-film are performed in this order.

First, the processing condition of the first deposition process consists in depositing the C-type-film (plasma enhanced tetra-ethyl-ortho-silicate (PE-TEOS) film, or the like) of 1000 nm in thickness within the control range of +/−10%. Then, in the step S51, the first deposition process is performed so as to fulfill this condition and a C-type-film 223 of FIG. 4A is deposited on a substrate 201 and a protrusion 202 of wiring or the like. Next, in the step S52, the thickness is measured by the first metrology process for measuring the result of this deposition. If the measured value is within the control range, the flow advances to the next step S53, but if it is out of the control range, the flow can not go ahead to the next step, as the deposition is defective.

The processing condition of the polishing process consists in polishing the remaining film to a thickness of 500 nm within the control range of +/−10%, and the polishing process is performed in the step S53 to fulfill this condition, leaving a C-type-film 223 shown in FIG. 4A. Next, in the step S54, the thickness is measured by the second metrology process for measuring the result of this polishing process. If the measured value is within the control range, the flow advances to the next step S55, but if it is out of the control range, the flow can not go ahead to the next step, as the deposition is defective.

At last, the processing condition of the second deposition process consists in depositing the C-type-film (PE-TEOS film, or the like) of 500 nm in thickness within the control range of +/−10% as shown in FIG. 4A; therefore, in the step S55, the second deposition process is performed in the step S55.

In this situation, the minimum value and the maximum value of the thickness of interlayer dielectric film, which is the sum of C-type-film 223 and 234 after the second deposition process are as follows. The situation where the minimum value can be obtained is shown in FIG. 4A. The minimum value being 800 nm, the deviation 225 from the set thickness 1000 nm is 200 nm. The minimum value is obtained when a film of 900 nm thickness is deposited in the first deposition process, depth of 550 nm is polished in the polishing process and the film of 450 nm thickness is deposited in the second deposition process. The situation where the maximum value can be obtained is shown in FIG. 4B. The maximum value being 1200 nm, the deviation 235 from the set thickness is 200 nm. The maximum value is obtained when the film of 1100 nm thickness is deposited in the first deposition process, depth of 450 nm is polished in the polishing process and the film of 550 nm thickness is deposited in the second deposition process. The designed central value of the thickness of the interlayer dielectric film after the second deposition process being 1000 nm, a deviation of ±20% is to be generated. The thickness of the obtained interlayer dielectric film will have a deviation of ±20% even when the thickness is controlled within ±10% in respective process.

The deviation of the interlayer dielectric film will scatter the wiring capacitance and, consequently, the wiring delay time. In the state of art, the miniaturization and the high level integration of semiconductor devices make the wiring delay time longer than the gate delay time, influence the integrated circuit delay time and, as a result, cause the scattering of the operation speed of the integrated circuit.

SUMMARY OF THE INVENTION

As shown by the aforementioned two conventional examples, in the semiconductor device composed of a number of continuous processes, the semiconductor device structure does not present the designed performance due to the accumulation of control range of respective processes, even if the processing is performed within the control range of respective manufacturing equipment in each individual process.

The present invention has been made in view of the problem above, and one of its objects is to provide a manufacturing method of miniaturized semiconductor devices without restricting the manufacturing equipment control range.

Another object of the present invention is to provide a manufacturing method of semiconductor devices wherein the number of metrology processes in the processing flow can be decreased.

Still another object of the present invention is to provide a manufacturing support system for allowing to process minute semiconductor devices by the manufacturing equipment without changing the conventional control range.

Still another object of the present invention is to provide a manufacturing system for allowing to process minute semiconductor devices by the manufacturing equipment without changing the conventional control range.

Still another object of the present invention is to provide a recording medium where a program allowing to process minute semiconductor devices without changing the conventional control range is stored.

Still another object of the present invention is to provide a recording medium where data necessary for allowing to process, with an extraordinary precision, minute semiconductor devices without changing the conventional control range is stored.

To attain the above objects, a first feature of the present invention inheres in a manufacturing method of semiconductor devices such as semiconductor integrated circuit or the like, comprising the steps of generating processing condition described as function of metrology process name, measuring the semiconductor device, generating new processing condition by linking this metrology result by this measuring with the processing condition, and manufacturing the semiconductor device itself measured under this new processing condition. Here, the metrology result includes film thickness, etching depth, line width and hole diameter, or others.

According to the first feature of the present invention, as the deviation from the designed value generated in a previous process can be compensated in a following process, not only the cumulatively increasing deviation through a number of processes is prevented, but also it can be made lower that the deviation generated in a single process. As the result, a minute semiconductor device can be manufactured by a conventional manufacturing equipment without changing the control rage. Thus, a method for manufacturing a miniaturized semiconductor device without restricting the manufacturing equipment control rage can be provided. The number of metrology processes in the processing flow can also be reduced, as only metrology process necessary for the compensation are to be performed.

The first feature of the present invention is effective by having a step for creating a processing flow where manufacturing process name to set the processing condition and metrology process name are arranged in the manufacturing order. The first feature of the present invention is effective by having a step for calculating processing parameter on new processing condition. These steps allow to automate the semiconductor manufacturing equipment. Processing parameter input into the manufacturing equipment or the like may become incorrect due to the processing condition variation according the metrology results; however, the automation can eliminate the error of processing condition introduction. Here, "processing parameter" means processing condition that can directly input into the semiconductor manufacturing equipment.

Also, the first feature of the present invention is effective when the step of setting processing condition with corresponding to manufacturing process name comprises steps of adding a data label to the metrology process name and setting the processing condition described as function of the data label. This allows to retrieve rapidly and easily from one of metrology process and processing conditions to the other. Otherwise, the same effect can be expected if the step of setting the processing condition as process name comprises steps of adding different process numbers to the manufacturing process name and the metrology process name and setting the processing conditions described as function of process number added to the metrology process.

Moreover, in the step of generating new processing condition, an advantageous effect can be expected by including steps of retrieving the metrology process name from the metrology results, detecting the data label or process number added to the metrology process name, and retrieving processing condition described as function of the same data label or process number. This allows to retrieve rapidly and easily from the metrology process name to the processing conditions described as function of the metrology process name. Additionally, in the step of generating new processing condition, an advantageous effect can be expected by including steps of extracting the processing conditions from the processing flow, judging if the processing conditions are described as function of data label or process number, and acquiring said metrology results from the metrology process name to which the same data label or process number is added. This allows to retrieve rapidly and easily from the processing conditions described as function of metrology process name to the metrology process name.

A second feature of the present invention inheres in a semiconductor device manufacturing support system comprising a link data setting unit for generating processing condition described as function of metrology process name, and a processing condition generation unit for generating new processing condition of the semiconductor device itself measured by linking the semiconductor device metrology results and the processing conditions.

According to the second feature of the present invention, a manufacturing support system for manufacturing a minute semiconductor device with a manufacturing equipment without changing the conventional control range can be provided.

A third feature of the present invention inheres in a semiconductor manufacturing system comprising the semiconductor device manufacturing support system of the second feature of the present invention, and a measurement device group for performing the metrology process of this semiconductor device itself and transmitting the metrology result to the support system.

According to the third feature of the present invention, a manufacturing system for manufacturing a minute semiconductor device with a manufacturing equipment without changing the conventional control range can be provided.

A fourth feature of the present invention inheres in a computer readable recording medium for storing a program comprising the steps of generating processing condition described as function of metrology process name and generating new processing condition by linking the metrology result with the processing conditions. Here, the recording medium includes, for example, semiconductor memory, magnetic disk, optical disk, magnetic tape or others devices that can record the program.

According to the fourth feature of the present invention, a recording medium for recording the manufacturing method for manufacturing with an extraordinary precision a minute semiconductor device with a manufacturing equipment without changing the conventional control range can be provided.

A fifth feature of the present invention inheres in a computer readable recording medium for storing data comprising at least manufacturing process name, metrology process name, data area for storing this manufacturing process name and metrology process name in the manufacturing order, processing condition corresponding to the manufacturing process name, and data area for storing this processing condition in correspondence to the data area for storing the manufacturing process name. Here, the recording medium includes, for example, semiconductor memory, magnetic disk, optical disk, magnetic tape or others devices that can record the program.

According to the fifth feature of the present invention, a recording medium for recording data used for the manufacturing method for manufacturing with an extraordinary precision a minute semiconductor device with a manufacturing equipment without changing the conventional control range.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 13 to FIG. 15 show data structures necessary for the semiconductor device manufacturing method according to the present invention;

FIG. 18 shows a data structure necessary for the semiconductor device manufacturing method in the first embodiment of the present invention;

FIG. 23 shows a data structure necessary for the semiconductor device manufacturing method according to the second embodiment of the present invention;

DETAILED DESCRIPTION OF THE EMBODIMENTS

Figure 1:
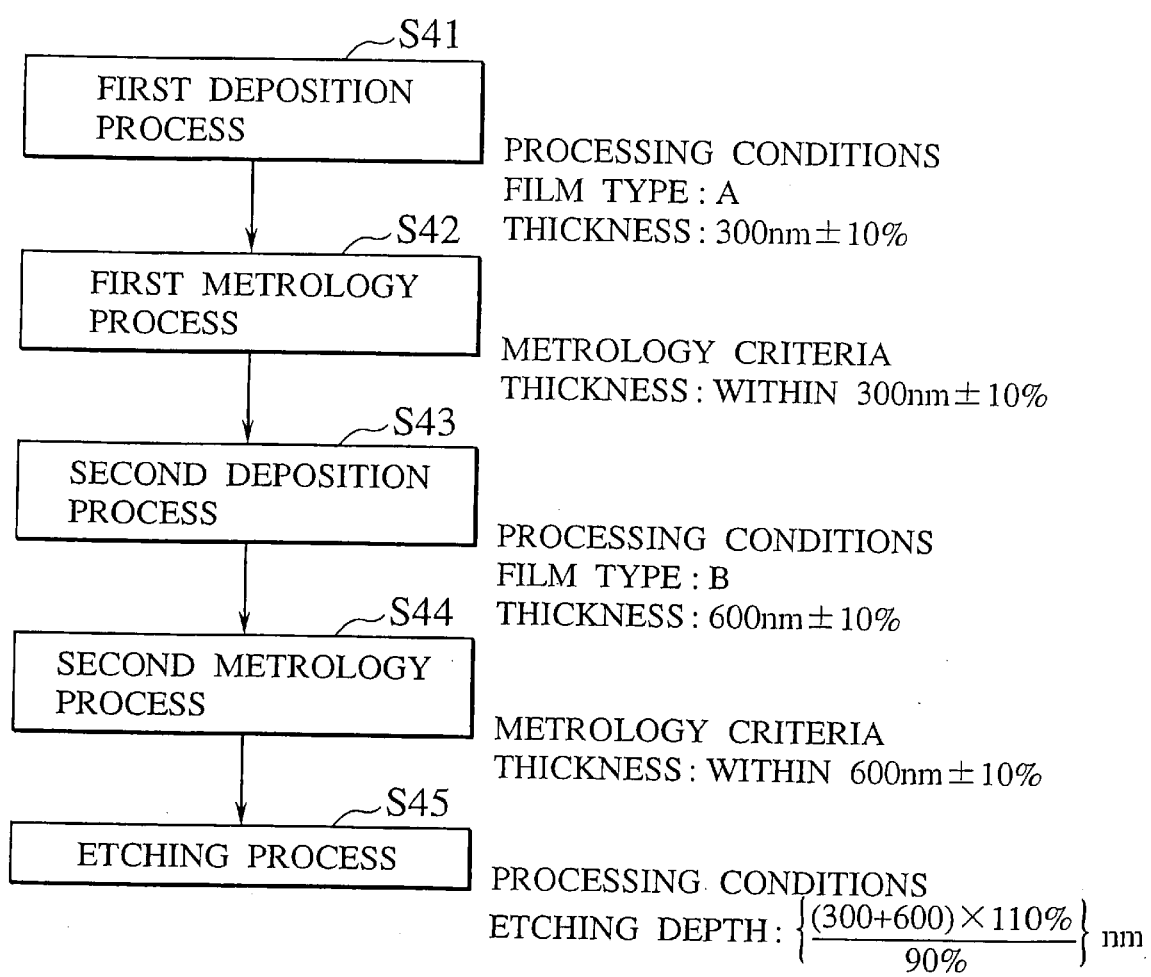
FIG. 1 shows a processing flow in a conventional example 1.
Figure 2A:
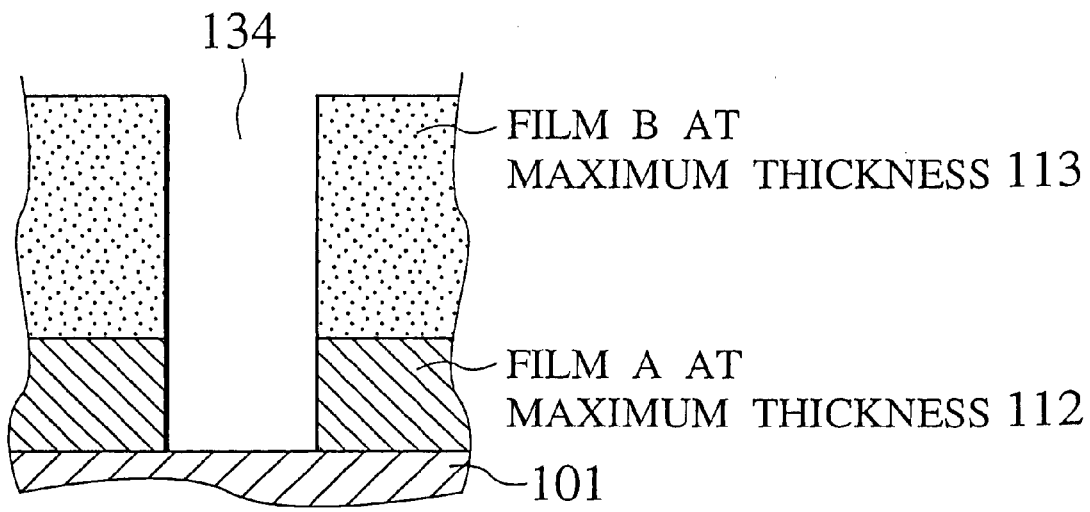
FIG. 2A and FIG. 2B are cross sections of the case where the film thickness is maximum and the over-etching minimum and the case where the film thickness is minimum and the over-etching maximum.
Figure 2B:
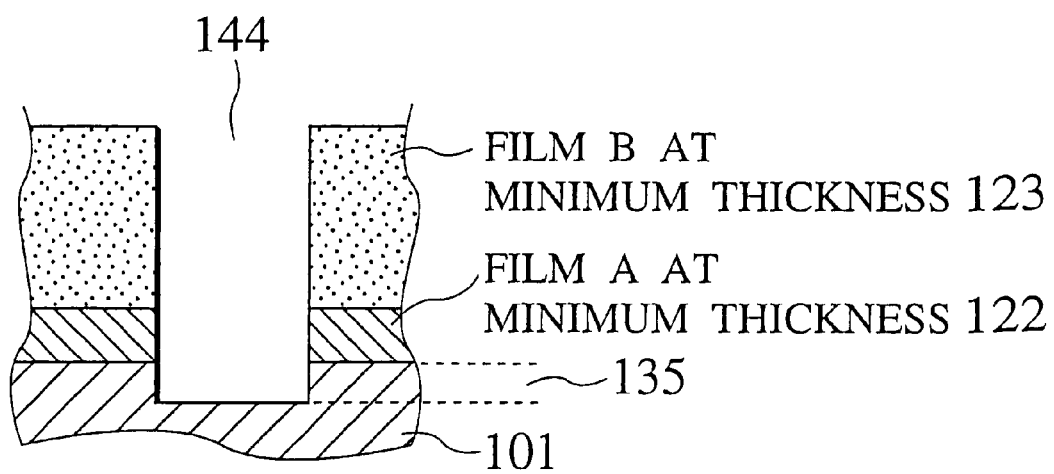

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

However, remark that drawings are schematic and the relation between thickness and plane dimensions, the thickness proportion of each layer may be different from the reality. As the consequence, the concrete thickness and dimensions are to be judged from the following description. Also, it is obvious that some of mutual dimensional relation or proportion may be different from one drawing to another.

Figure 5:
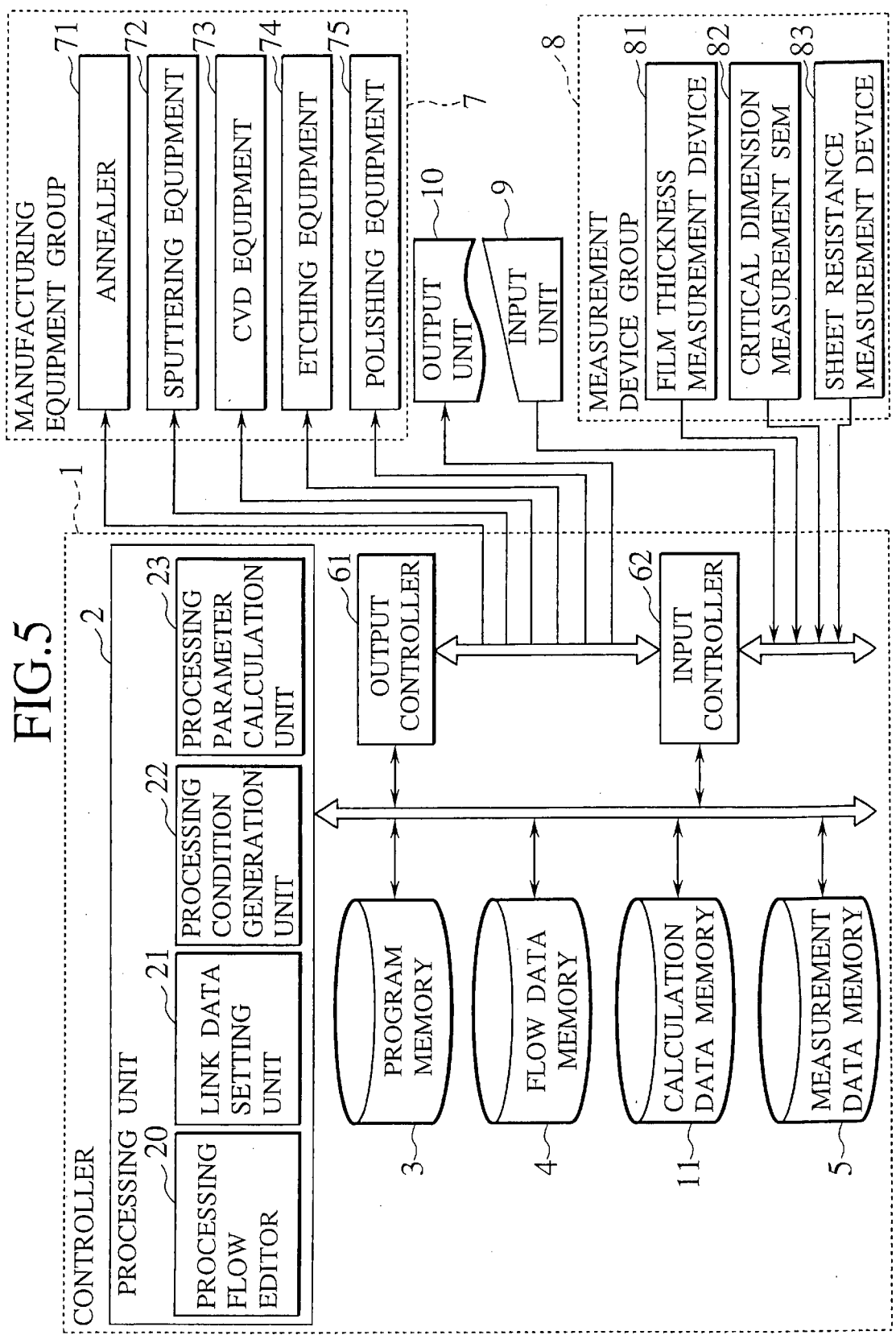
FIG. 5 shows a schematic composition of a controller used for the manufacturing of semiconductor device according to the present invention.

As shown in FIG. 5, the semiconductor device manufacturing support system (controller) 1 comprises a link data setting unit 21 for setting processing conditions described as function of previous metrology process name as process name, and a processing condition generation unit 22 for linking the previous metrology results with the processing conditions described as function of previous metrology process name and generating new processing conditions according to the metrology results. The semiconductor device manufacturing system according to the present invention comprises the support system 1, and a measurement device group 8 for performing the measurement of the previous metrology process name, and transmitting this metrology results, and it may include a manufacturing equipment group 7 for receiving the new processing conditions and performing the semiconductor device manufacturing. Here, "previous" means earlier step in the processing flow wherein processes are arranged in the manufacturing order. The link data setting unit 21 and the processing condition generation unit 22 are arranged in a processing unit 2, however, a processing flow editor 20, and a processing parameter calculation unit 23 may also be arranged in the processing unit 2. Sometimes, a program memory 3 for recording a program to be executed in the processing unit 2 is connected to the processing unit 2 via the bus line. A processing flow data memory 4 for recording the processing flow created by the processing flow editor 20 may be connected to the processing unit 2 via the bus line. As the case may be, a calculation data memory 11 for recording calculation data to be used for the calculation in the processing parameter calculation unit 23 is connected to the processing unit 2 via the bus line. An output controller 61 is also connected to the processing unit 2 via the bus line, for outputting processing conditions of respective semiconductor device set in the processing condition generation unit 22, or processing parameters of respective semiconductor device calculated by the processing parameter calculation unit 23.

An input controller 62 is connected to a measurement data memory 5 via the bus line, and metrology results are input from the input controller 62. An input unit 9 for inputting the program, processing flow data and measurement data is connected to the input controller 62. An output unit 10 for outputting semiconductor device processing condition, semiconductor device processing parameters, the program, processing flow data and measurement data is connected to the output controller 61. The manufacturing equipment group 7 comprises an annealing furnace 71, a sputtering equipment 72, a chemical vapor deposition (CVD) furnace 73, an etching equipment 74 and a polishing equipment, is connected to the output controller 61, and receives processing parameters. The measurement device group 8 comprises a film thickness measurement device 81, a critical dimension measurement scanning electron microscope (SEM) 82, a sheet resistance measurement device 83 or the like, is connected the input controller 62 and transmits previous metrology results of a semiconductor device.

Next, employing a flow chart shown in FIG. 6, the semiconductor device manufacturing method is explained as follows.

(a) First, in the step S1, the processing flow editor 20 creates a processing flow wherein manufacturing process names and previous metrology process names are arranged in the manufacturing order.

(b) In the step S2, the link data setting unit 21 sets processing conditions described as function of previous metrology process name as process name.

(c) In the step S3, the processing condition generation unit 22 links the previous metrology results with the processing conditions described as function of previous metrology process name and generates new processing conditions according to the metrology results.

(d) In the step S4, the processing parameter calculation unit 23 calculates processing parameters from the new processing conditions according to the metrology results. Here, in the processing parameter calculation, not only expressions are calculated, but also the processing condition range to be set may be divided into a number of areas, and processing parameters corresponding to each of these areas may be set in advance. In this case, when processing conditions are set, the belonging areas are decided and corresponding processing parameters are selected. Moreover, when there are processing equipment for the same application, the equipment can be designated as a processing parameter. For example, when there are a plurality of CVD furnace 73, one CVD furnace presenting a higher deposition speed at the center of the processing substrate than the peripheries and the other presenting a lower deposition speed at the center of the processing substrate than the peripheries, the deposition equipment may be selected according to the processing conditions.

(e) In the step S5, the manufacturing equipment group 7 fabricates semiconductor devices by a sequence of the manufacturing process with the processing parameters. In the step S6, the measurement equipment group 8 measures the fabricated results.

(f) In the step S7, it is determined if the processing flow has terminated. If it has not terminated, it will return to the step S3 to acquire the previous metrology results or processing condition. If the processing flow has terminated, the flow of semiconductor device manufacturing method according to the present invention terminates.

Figure 6:
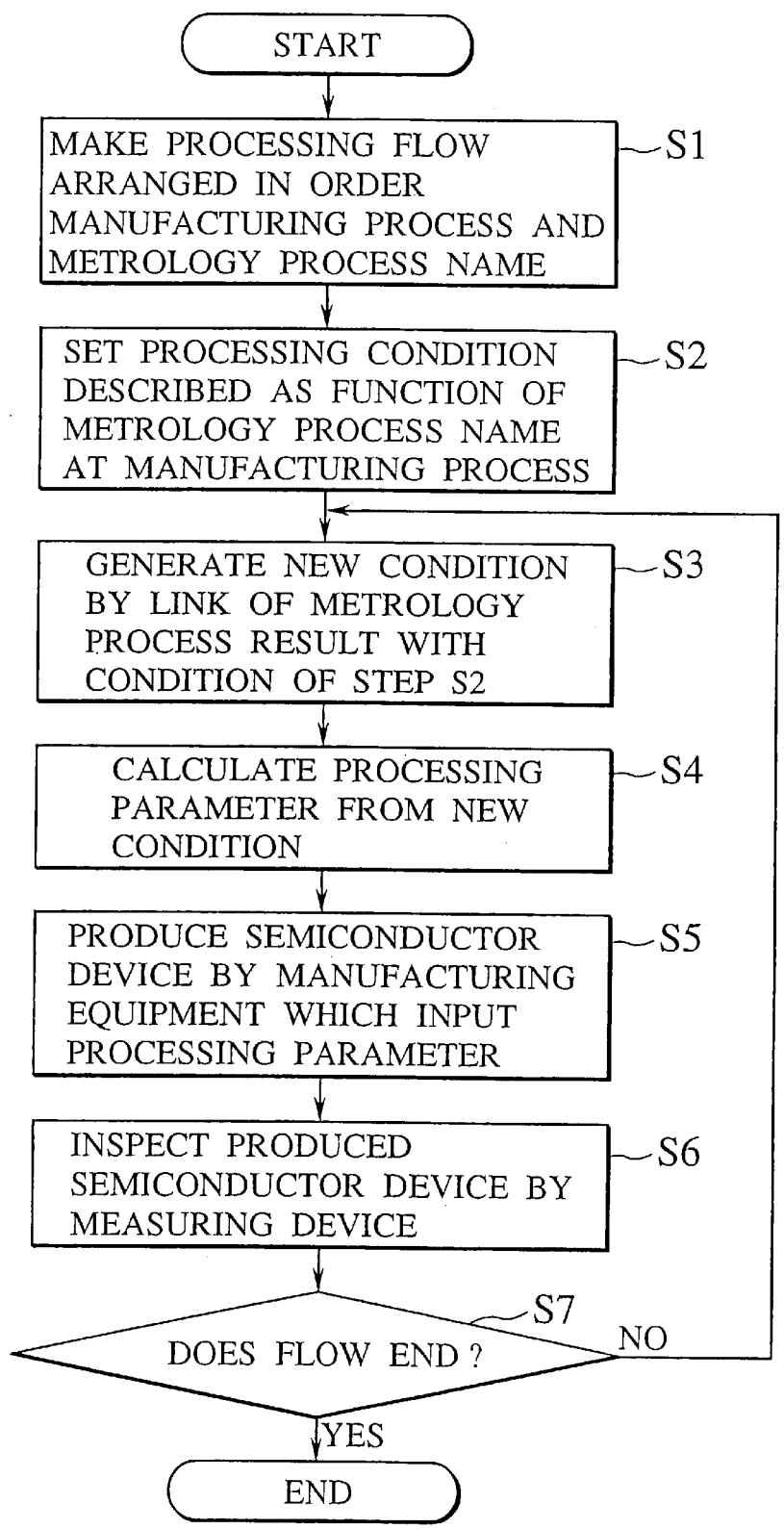
FIG. 6 is a flow chart of manufacturing method of semiconductor device according to the invention.
Figure 7:
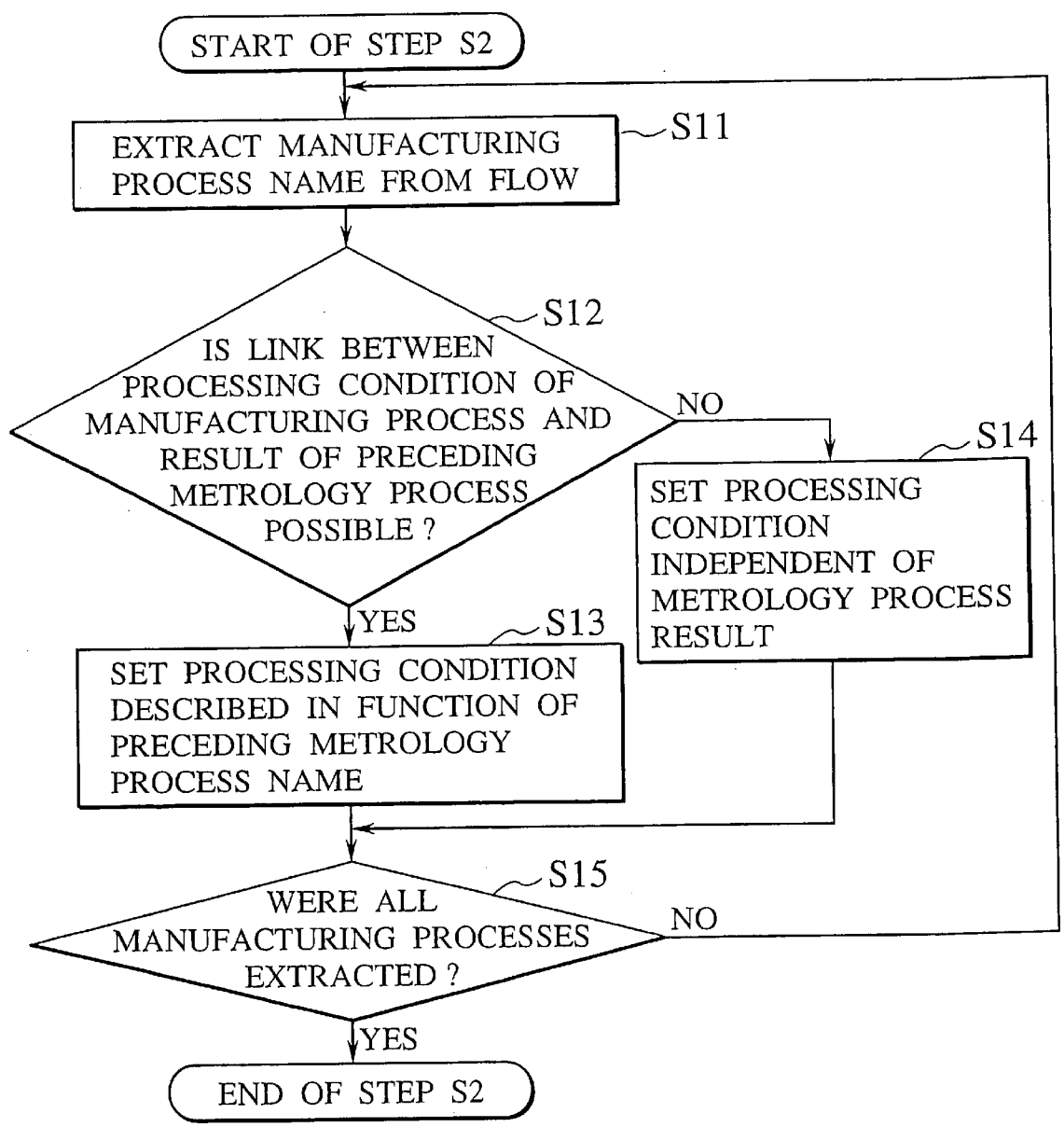
FIG. 7 is a flow chart showing the flow in the step S2 of FIG. 6.

The detailed flow in the step S2 shown in FIG. 6 is explained by a flow chart shown in FIG. 7. In the step S11, the process name is extracted from the processing flow. In the step S12, it is determined if the processing conditions in the process can be linked with the previous metrology results. If the linkage is possible, in the step S13, processing conditions described as function of previous metrology process name are set as process. If the linkage is impossible, in the step S14, the processing conditions are set independently of the metrology results. In the step S15, it is determined if all processes are extracted. If it is determined that all are extracted, the steps S2 will terminate. If it is determined that all are not extracted, the process names will be extracted from the processing flow again in the step S11.

Figure 8:
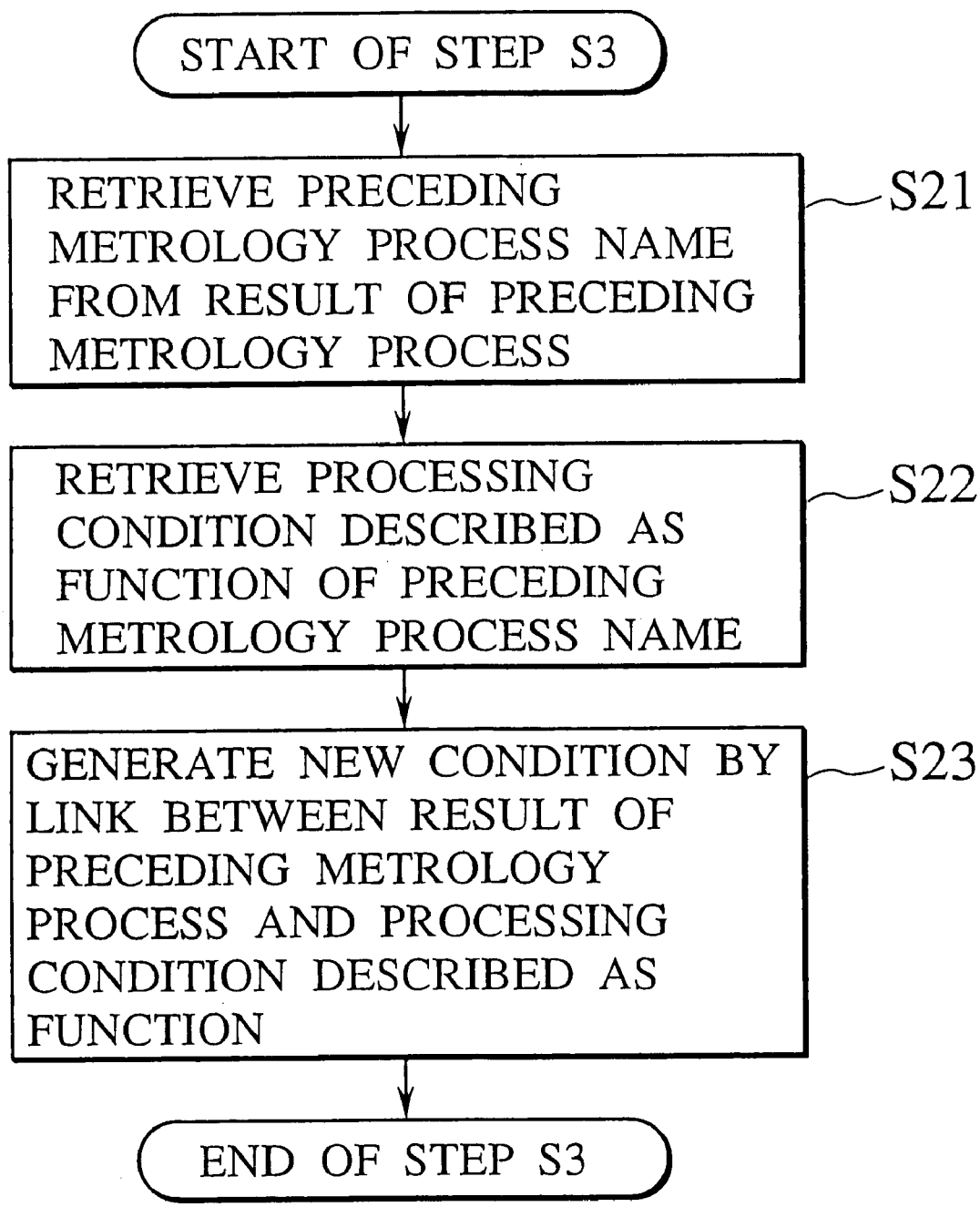
FIG. 8 and FIG. 9 are flow charts showing the flow in the step S3 of FIG. 6.

The detailed flow in the step S3 is explained by a first flow chart shown in FIG. 8. Processing conditions described as function of previous metrology process name are retrieved from the previous metrology process. In the step S21, metrology process name is retrieved from the previous metrology results. In the step S22, processing conditions described as function of previous metrology process name are retrieved. In the step S23, processing conditions corresponding to the metrology results are generated by linking the previous metrology results and the processing conditions described as function of previous metrology process name. This flow can start at the time when the previous metrology process has terminated. As the consequence, this flow allows to minimize the processing waiting time of the manufacturing equipment.

Figure 9:
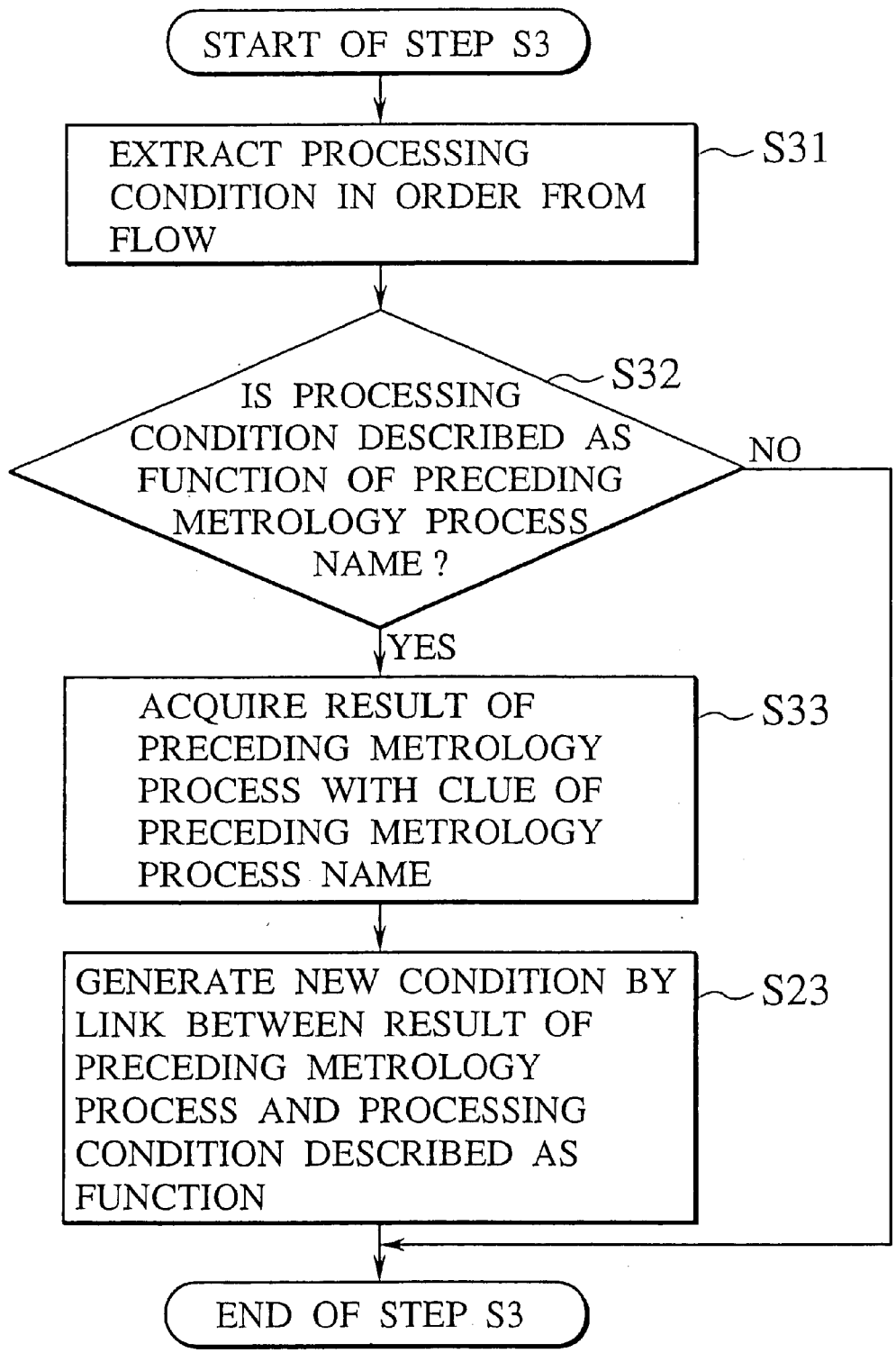

The detailed flow in the step S3 is explained by a second flow chart shown in FIG. 9. Contrary to the flow of FIG. 8, the previous metrology process name is retrieved from the processing conditions described as function of previous metrology process name. In the step S31, processing conditions are extracted from the processing flow in the manufacturing order. In the step S32, it is determined if processing conditions are described as function of previous metrology process name. If they are not described, the step 3 terminates. It they are described, in the step S33, previous metrology results are obtained from the previous metrology process name. In the step S23, processing conditions corresponding to the metrology results are generated by linking the previous metrology results and the processing conditions described as function of previous metrology process name.

Figure 10:
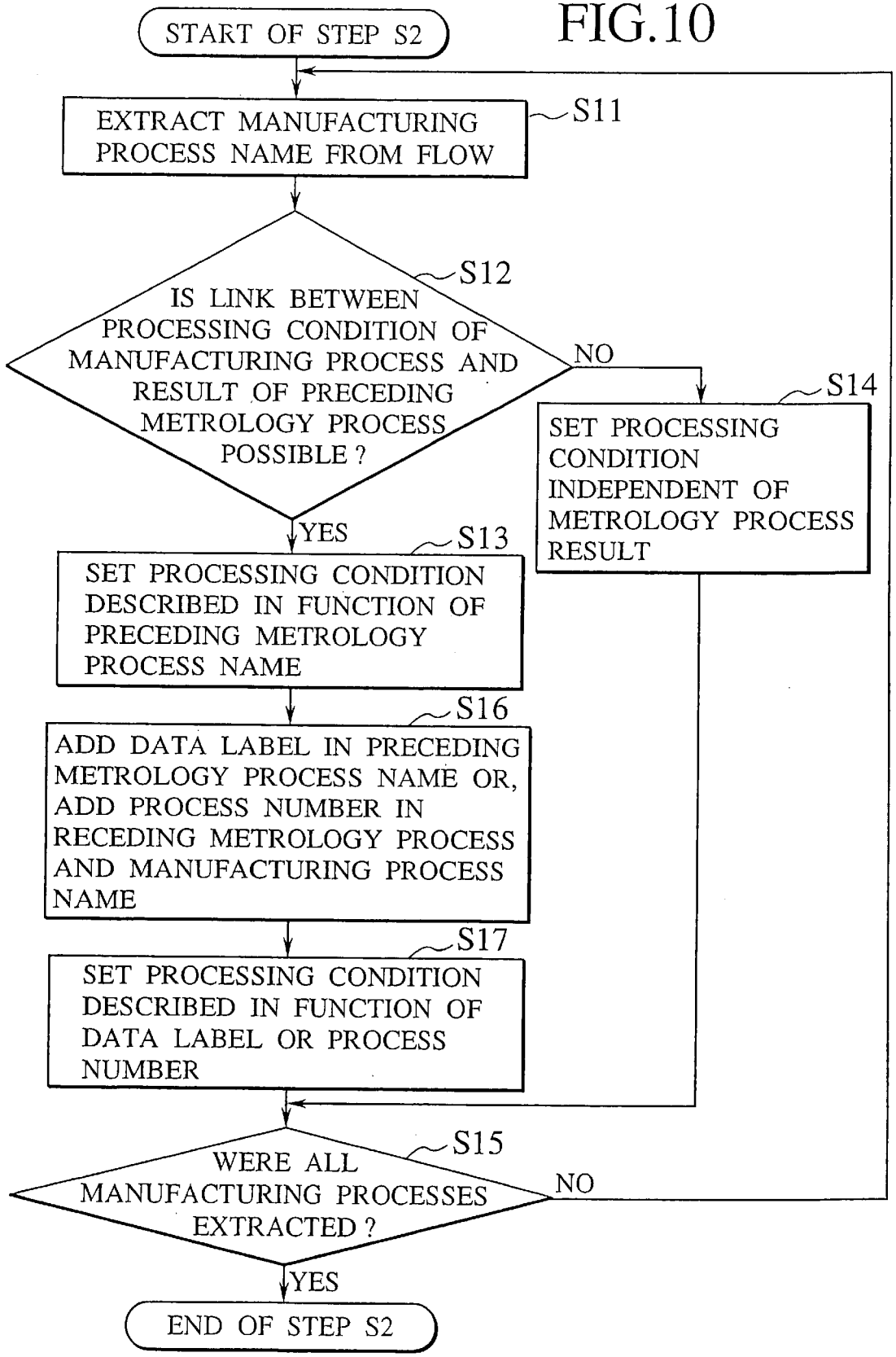
FIG. 10 is a flow chart showing the flow in the step S2 of FIG. 6 according a first and a second embodiment of the present invention.

The detailed flow in the step S2 is explained by a flow chart shown in FIG. 10. The addition of the step 16 and the step 17 allows to enhance the retrieve ability compared to the flow of FIG. 7. In the step S16, a data label is added to the previous metrology process name. Otherwise, a process number is added to the process name and the previous metrology process name. In the step S17, processing conditions described as function of previous metrology process name are described as function of data label or process number added to the previous metrology process name and set as process.

Figure 11:
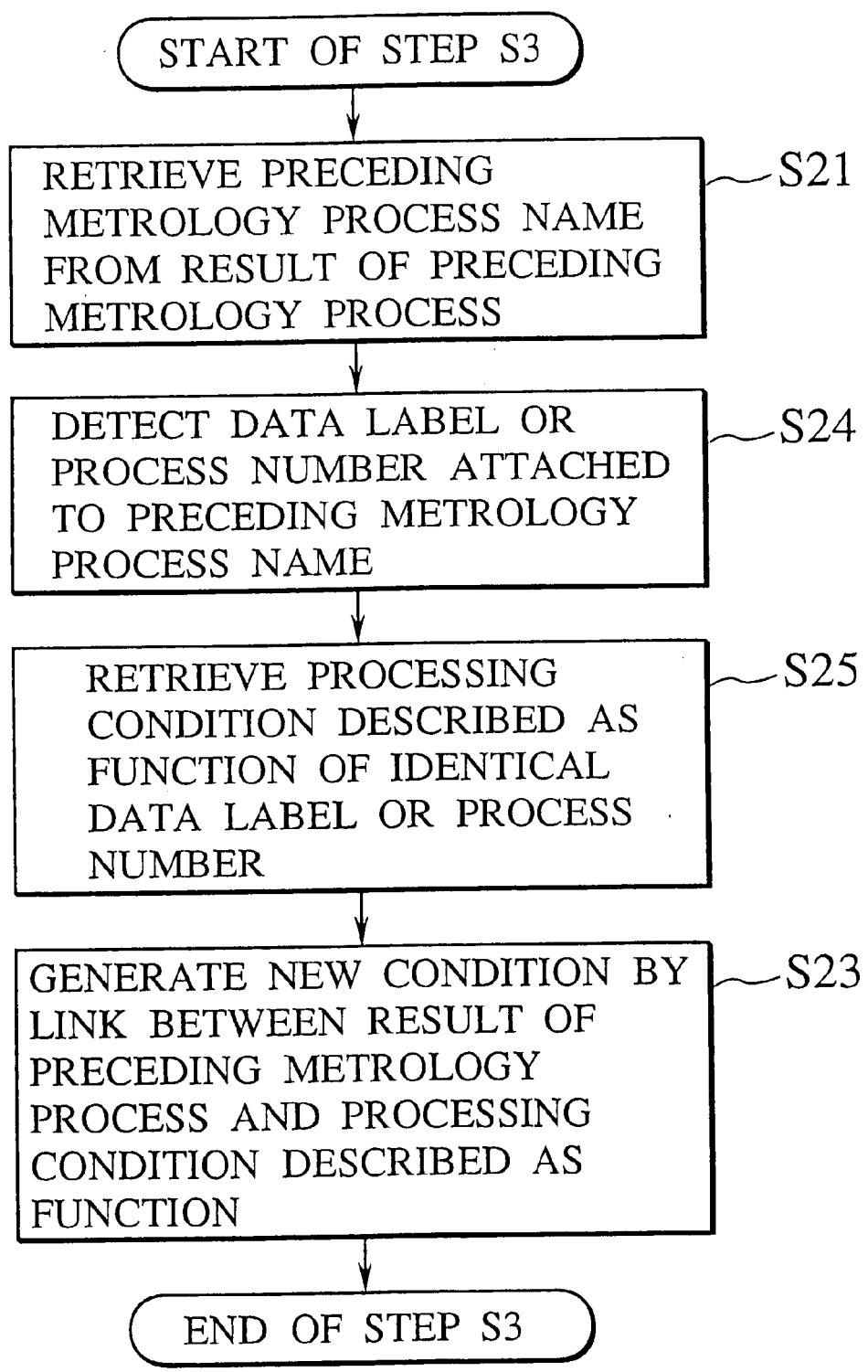
FIG. 11 is a flow chart showing the flow in the step S3 of FIG. 6 according the first embodiment of the present invention.

The detailed flow in the step S3 is explained by a third flow chart shown in FIG. 11. The insertion of the steps S24 and S25 in place of the step 32 allows to enhance the retrieve capability compared to the flow of FIG. 8. In the step S24, the data label or process number added to the previous metrology process name are detected. In the step 25, processing conditions described as function of the same data label or process number are retrieved.

Figure 12:
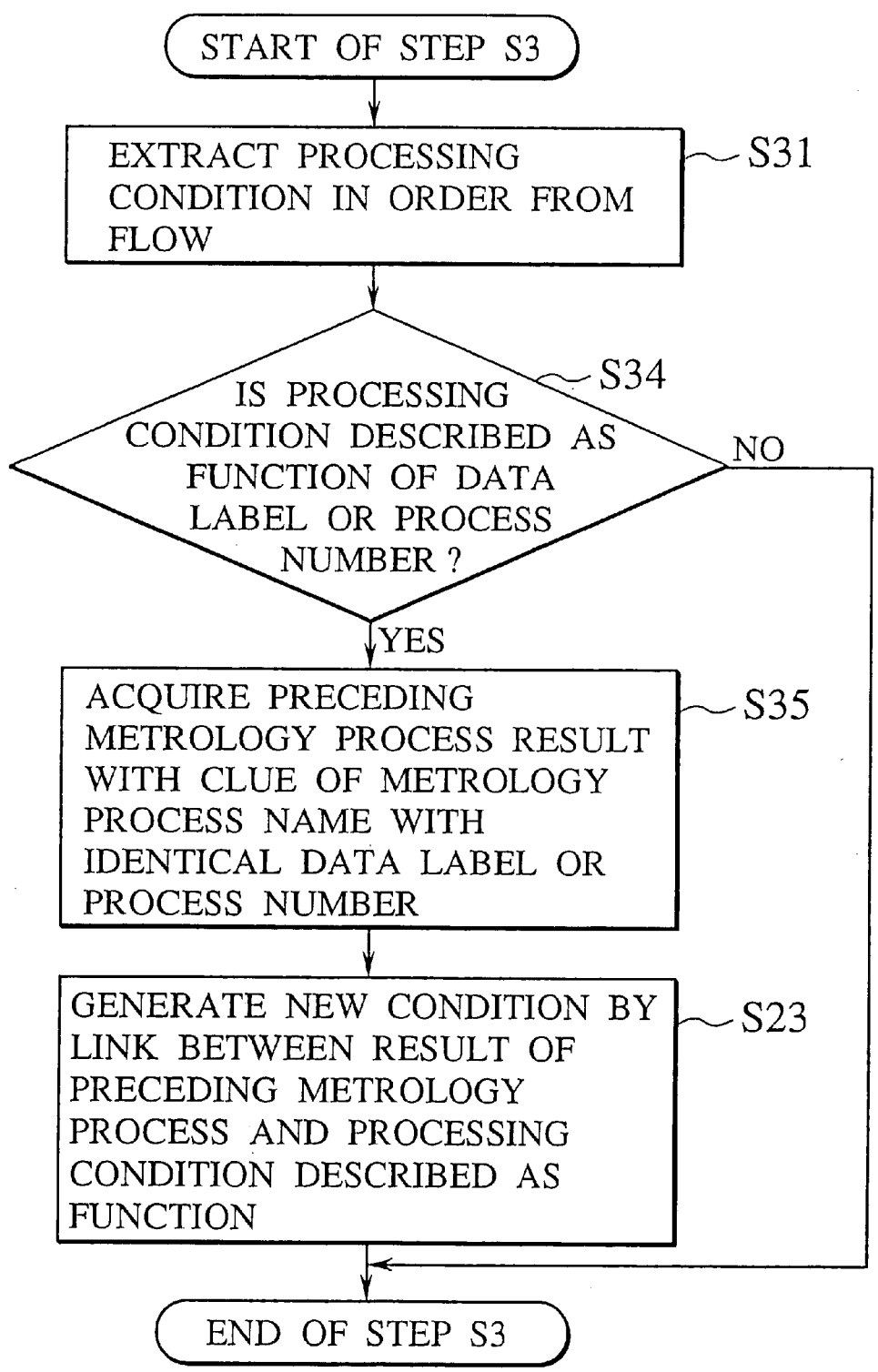
FIG. 12 is a flow chart showing the flow in the step S3 of FIG. 6 according the second embodiment of the present invention.

The detailed flow in the step S3 is explained by a fourth flow chart shown in FIG. 12. The replacement of the step S32 and the step 24, and the replacement of the step 33 and the step S35 allows to enhance the retrieve capability compared to the flow of FIG. 9. In the step S34, it is judged if processing conditions are described as function of data label or process number. In the step 35, the previous metrology results are obtained from the previous metrology process name to which the same data label or process number are added.

Note that a program for performing said series of processing by computer is recorded in a computable readable recording medium. That is contained in a program memory 3 of FIG. 5. Here, the recording medium includes, for example, semiconductor memory, magnetic disk, optical disk, magnetic tape or others devices that can record the program.

Now, the detailed data is explained by a first data structure shown in FIG. 13. It comprises a data area 41 for storing manufacturing process names and metrology process names in the manufacturing order, and a data area 42 for storing a single or a plurality of processing conditions for each process name. It is in a processing condition e1 that can be linked with the previous metrology results that a function 43 of the previous metrology process name is stored. Processing conditions independent of the metrology results are set as processing conditions a1, a2, c1, c2, c3 and e2. This data structure is recorded in a computer readable recording medium, and that is contained in a processing flow data memory unit 4 of FIG. 5. As mentioned above, such recording medium includes, for example, semiconductor memory, magnetic disk, optical disk, magnetic tape or others media that can record data.

The detailed data is explained by a second data structure shown in FIG. 14. Compared to FIG. 13, a data label b1 is added anew to the metrology process B and a data label d1 to the metrology process D. As a processing condition e1 likable with the results of previous metrology process B and D, a function 44 of the data labels b1 and d1 are set.

The detailed data is explained by a third data structure shown in FIG. 15. Compared to FIG. 13, anew, it comprises a data area 40 for storing process numbers showing the manufacturing order. A process number is added to each and every process name and metrology process name. As a processing condition e1 likable with the results of previous metrology process B and D, a function 45 of the process numbers n+2 and n+4 are set.

Figure 16:
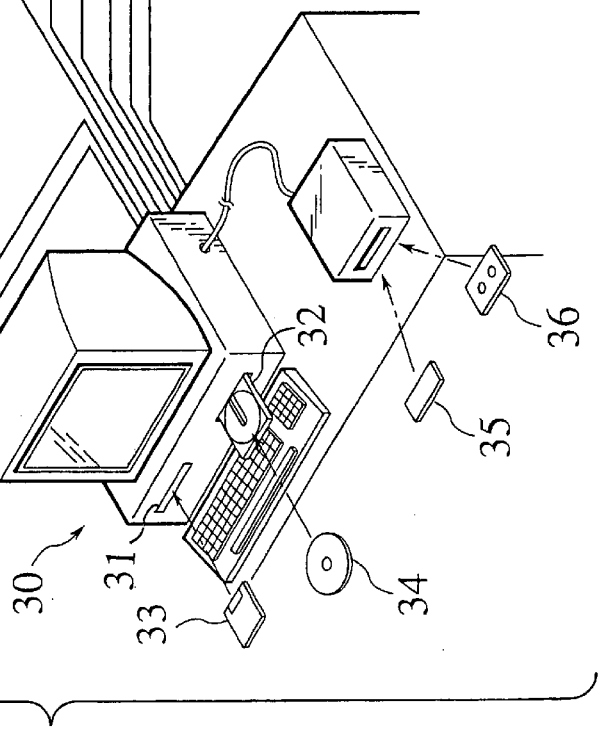
FIG. 16 is an external appearance view showing the relation ship among a recording medium according to the present invention, a computer system and peripherals.

An external appearance of a computer system is shown in FIG. 16. The computer system reads the program stored in the recording medium, sets processing condition and further executes parameter according to the procedure described therein, and stores in a recording medium the processing flow created by this step as data. The body front of this computer system 30 is provided with a floppy disk drive 31, and a CD-ROM drive 32, and a floppy disk 33 or a CD-ROM 34 can be inserted into the slot of respective drive to perform the pre-determined reading-out operation and to install the program contained in such recording medium into the system. On the other hand, by performing a pre-determined writing operation, data necessary for controlling the semiconductor device manufacturing system can be recorded in such recording medium. Moreover, by connecting a predetermined drive unit, for example, a ROM 35 as semiconductor memory used for game pack or the like, or a cassette tape 36 as magnetic tape can also be used. Additionally, the body of the computer system 30 and the manufacturing equipment group 7 are connected to transmit set processing conditions or processing parameters to the manufacturing equipment group 7. The body and the measurement device group 8 are also connected to transmit the metrology results.

(First Embodiment)

Figure 17:
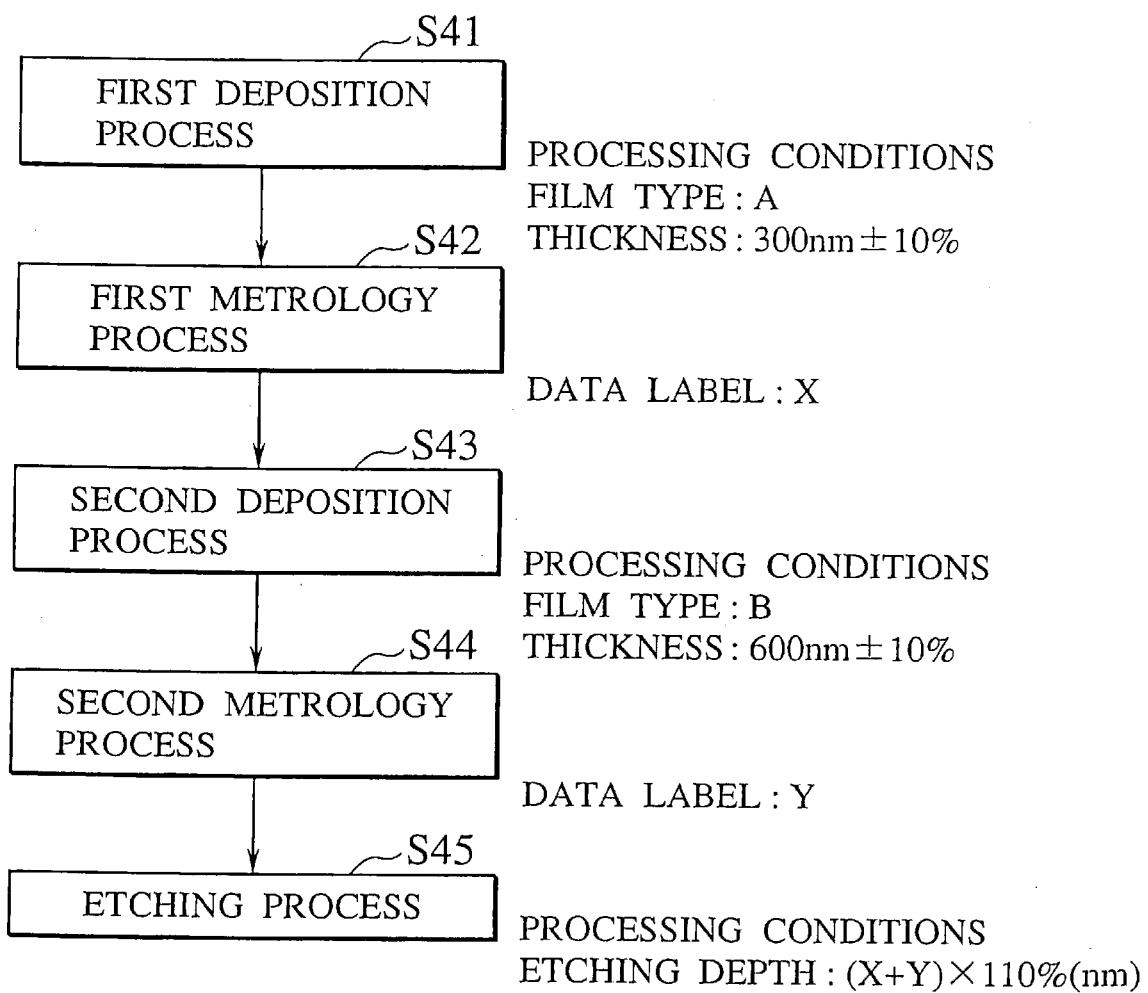
FIG. 17 shows a processing flow in a first embodiment of the present invention.

The semiconductor device manufacturing method according to a first embodiment of the present invention will be described. Here an example of processing flow of a semiconductor device having a A-type-film and a B-type-film as interlayer dielectric film, and a contact hole, is explained as shown in FIG. 17. The flow chart of the semiconductor device manufacturing method according to the first embodiment follows the flow chart diagram of FIG. 6, FIG. 10 and FIG. 11.

(a) First, in the step S1 of FIG. 6, a processing flow is created wherein manufacturing process names and metrology process names are arranged in the manufacturing order. This processing flow comprises a step S41 for depositing a A-type-film in a first deposition process, a step S42 for measuring the thickness of the A-type-film in a first metrology process, a step S43 for depositing a B-type-film in a second deposition process, a step S44 for measuring the thickness of the B-type-film in a second metrology process, and at last, a step S45 for etching the A-type-film and the B-type-film to form a contact hole in a etching process.

(b) Second, the step S2 of FIG. 6 is performed, or more in detail, the processing shown in FIG. 10 is performed. In the step S11 of FIG. 10, the first deposition process (step S41 in FIG. 17), process name, is extracted from the processing flow. In the step S12, it is determined if the processing conditions in the first deposition process can be linked with the results of metrology process that should be executed before the step S41. As the linkage is impossible, in the step S14, the film type is set to A and the thickness within 300 nm +/−10% as processing conditions independent of metrology results. In the step S15, it is determined if all processes are extracted. As all are not extracted, it returns to the step 11 to extract the second deposition process (step S43 in FIG. 17). In the step 12, it is determined if the processing conditions in the second deposition process can be linked with the results of metrology process that should be executed before the step 43. The second deposition process and the first metrology process can be linked for semiconductor devices for which it is necessary to control the total thickness of the A-type-film deposited in the first deposition process and the B-type-film deposited in the second deposition process. However, for this semiconductor device, the linkage is made impossible, because it is desirable that the B-type-film thickness is constant and it is undesirable that it varies according to the A-type-film thickness. Thereafter, as for the first deposition process, the film type is set to B and the thickness within 600 nm +/−10%. In the step S15, it is determined if all processes are extracted. As all are not extracted, it returns to the step 11 to extract the etching process. In the step 12, it is determined if the processing conditions in the etching process can be linked with the results of previous metrology process. As they can be linked, in the step S13, the etching depth, processing condition described as function of the first metrology process and the second metrology process, previous metrology process process names, is set at processing condition of etching process. This etching depth can be expressed by the formula (1).

$$(\text{Etching depth}) = ((\text{First metrology process}) + (\text{Second metrology process})) \times 110\% \quad (1)$$

In the step S16, data labels X and Y are added to the first metrology process and the second metrology process, previous metrology process names. In the step S17, the etching depth is set as function of data labels X and Y. This etching depth can be expressed by the formula (2).

$$(\text{Etching depth}) = (X + Y) \times 110\% \quad (2)$$

In the step S15, it is determined if all processes are extracted. As all are extracted, the step S2 terminates.

FIG. 18 shows a data structure added to the processing flow. Manufacturing process name and metrology process name are stored in a data area 41, while processing conditions and data label are stored in a data area 42. A data label X is added to the first metrology process and a data label Y to the second metrology process. The etching depth, processing condition of the etching process is described by the function 46 of data labels X and Y.

(c) Next, the processing of the step S3 and thereafter are performed; the processing of the step S3 and thereafter accompany real semiconductor device manufacturing and metrology processes. FIG. 19A to FIG. 19D shows the cross-section of semiconductor devices in the course of manufacturing.

Figure 19A:
FIG. 19A and FIG. 19D are cross sections illustrating the semiconductor device manufacturing method in the first embodiment of the present invention.
Figure 19B:
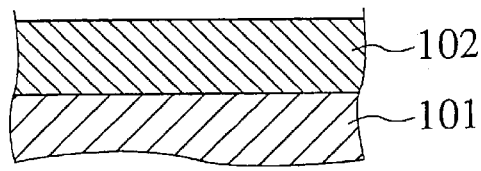

A substrate 101 is prepared as shown in FIG. 19A. Then, in the first metrology process of the step S41 shown in FIG. 17, a A-type-film 102 is deposited on the substrate 101 as shown in FIG. 19B. The processing condition of the first deposition process consists in depositing the A-type-film 102 (for example, BPSG film) with a thickness of 300 nm. As this processing condition is independent of the metrology results, the processing of the step S3 is skipped, and in the step S4 of FIG. 6, processing parameters such as deposition time or material gas flow are calculated from the processing conditions. In the step S5 of FIG. 6, the film is deposited by a CVD equipment 73 using processing parameters such as deposition time or others.

(d) Next, in the step S6 of FIG. 6, the thickness is measured by the first thickness metrology process of the step S42 shown in FIG. 17. The metrology results are recorded in a measurement data memory 5. In the step S7 of FIG. 6, it is determined if the processing flow has terminated. As the processing flow is not terminated, it returns to the step S3 of FIG. 6. In the step S3, it further returns to the step S21 of FIG. 11. In the step S21 of FIG. 11, the first metrology process is retrieved from the thickness data, metrology result of the first metrology process. In the step S24 of FIG. 11, it is retrieved the etching depth of the etching process, processing condition described as function of data label X. In the step S23 of FIG. 11, the thickness, metrology result of the first thickness metrology process, and the etching depth are linked to generate new processing conditions. To be more specific, the thickness, metrology result of the first thickness metrology process, is substituted in the function of etching depth. However, the data label Y in the etching depth function is undefined, the processing parameter can not be calculated from the etching depth generated in this phase and steps S4, S5 and S6 of FIG. 6 are skipped. In the step S7 of FIG. 6, it is determined if the processing flow has terminated. As the processing flow is not terminated, it returns to the step S3 of FIG. 6.

Figure 19C:
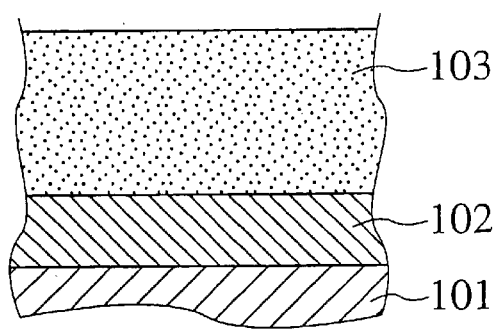

The processing condition of the second thickness metrology process consists in depositing the B-type-film 103 (for example, NSG film) of 600 nm in thickness. As this processing condition is independent of the metrology results, the processing conditions are treated as for the first thickness metrology process, and the second deposition process is performed in the step S43 of FIG. 17. The film 103 is deposited as shown in FIG. 19C.

(e) Further, in the step S6 of FIG. 6, the thickness is measured by the second thickness metrology process of the step S44 shown in FIG. 17. The metrology results are recorded in a measurement data memory 5. In the step S7 of FIG. 6, it is determined if the processing flow has terminated. As the processing flow is not terminated, it returns to the step S3 of FIG. 6, and further, in the step S21 of FIG. 11, the second metrology process is retrieved from the thickness, metrology result of the second metrology process. In the step S24 of FIG. 11, it is retrieved the etching depth of the etching process, processing condition described as function of data label Y. In the step S23 of FIG. 11, the thickness, metrology result of the second metrology process, and the etching depth already linked with the thickness, metrology result of the first metrology process, are linked to generate new processing conditions corresponding to the metrology results. To be more specific, the thickness, metrology result of the second metrology process, is substituted in the function of etching depth. As data labels X and Y in the etching depth function are defined, in the step S4 of FIG. 6, processing parameters such as etching time, material gas flow or the like are calculated from the etching depth, processing condition. In the step S5 of FIG. 6, the etching of the step S45 of FIG. 17 is performed by an etching equipment 74 using etching time or the like. In the step S7 of FIG. 6, it is determined if the processing flow has terminated. As the processing flow is terminated, the flow of FIG. 6 also terminates.

Figure 19D:
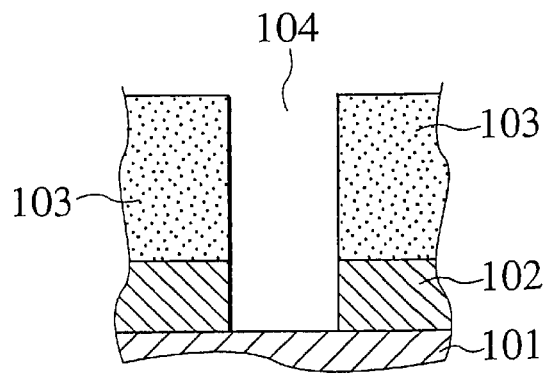
Figure 20A:
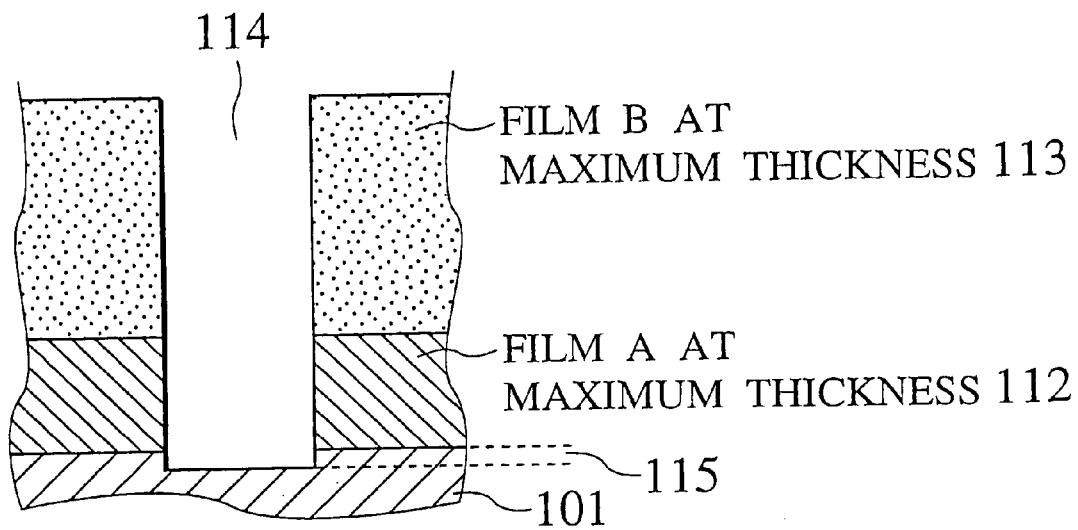
FIG. 20A and FIG. 20B are cross-sections of the case where the over-etching becomes maximum when the film thickness in the first embodiment of the present invention is maximum and minimum respectively.
Figure 20B:
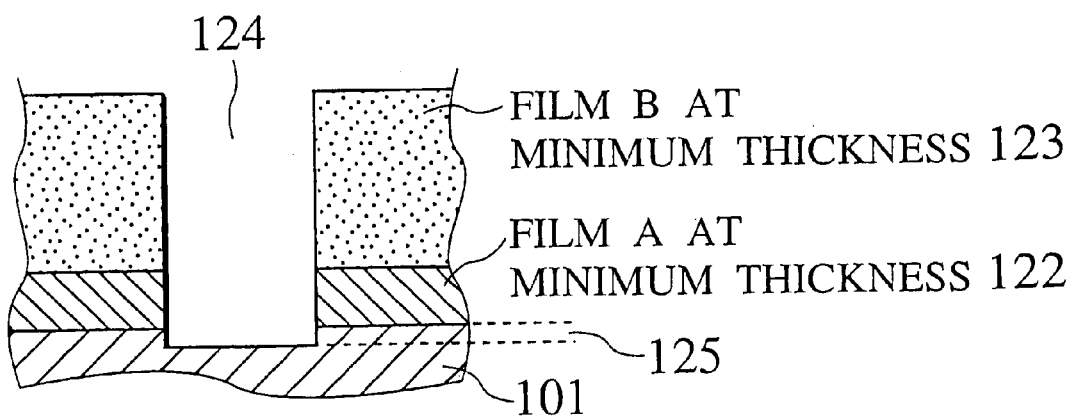

In the etching process of the step S45 of FIG. 17, the A-type-film 102 and the B-type-film 103 are etched to eliminate them completely as shown in FIG. 19D and a contact hole 104 is formed. Then, the etching depth is determined for respective thickness of the A-type-film 102 and the B-type-film 103 of each processing lot of semiconductor device or for respective film thickness of layered films. In the present case, processing temporary conditions are decided considering the layered film thickness of the A-type-film 102 and the B-type-film 103 and controllable processing range of 10% of the etching equipment. For example, when the thickness of layered films becomes maximum, the thickness will be 990 nm, maximum value of the control range to the sum of the thickness 300 nm of the A-type-film 112 and the thickness 600 nm of the B-type-film 113. The etching depth is set to 1100 nm so that the etching can be performed and the contact hole be formed, even when it has decreased of 10% within the control range. In this case, over-etching is performed, and the substrate will be etched. The substrate etching speed decreases to about 10% of the etching speed of the A-type-film and the B-type-film, the maximum over-etching depth 115 attaining 22 nm. Similarly, when the layered film thickness is minimum, the maximum over-etching depth 125 will be 18 nm for the formation of the contact hole 124. These values are reduced to the half of the conventional example 1. Thus, minute semiconductor devices can be processed with an extraordinary precision without restricting the control range of the manufacturing equipment.

(Example of the First Embodiment)

Figure 21:
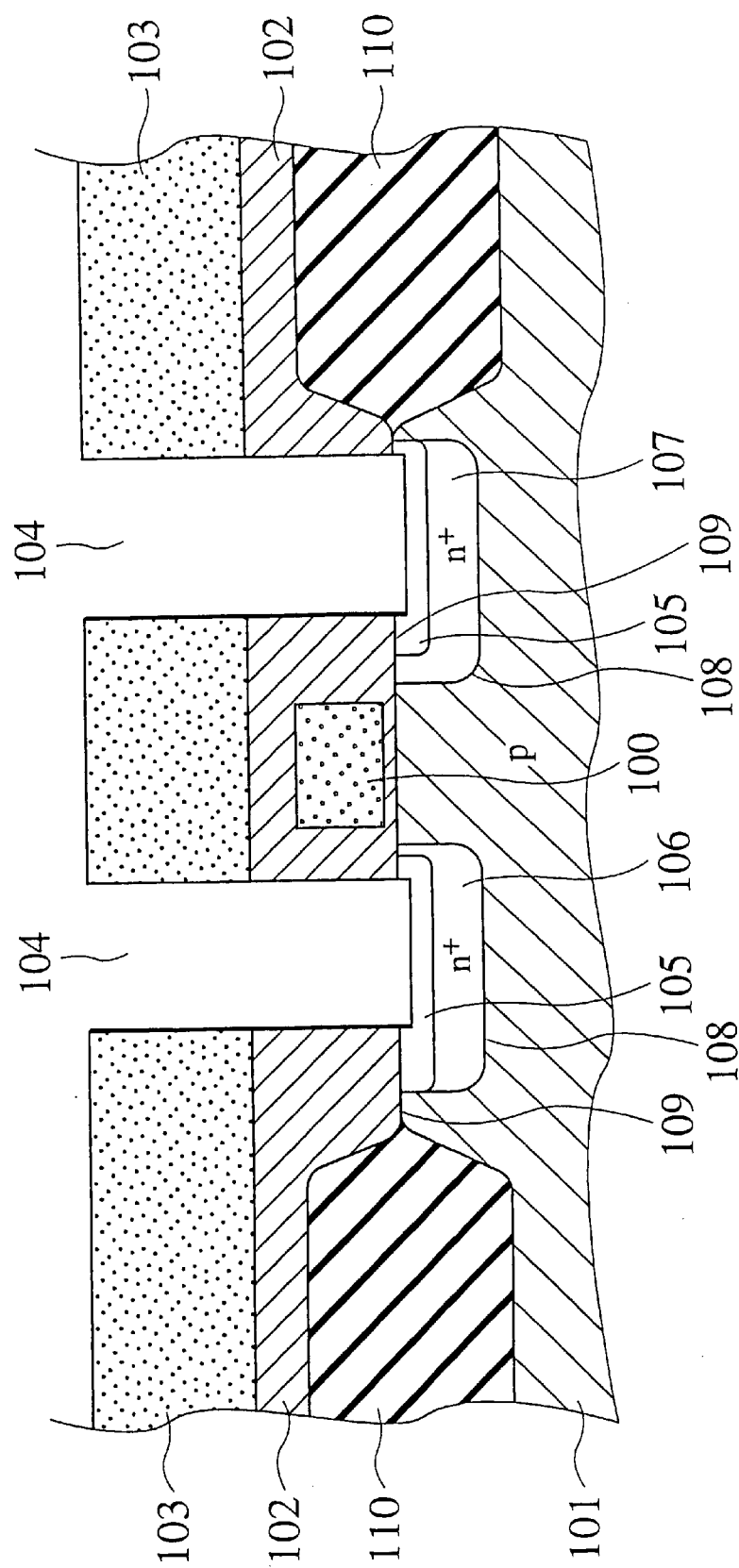
FIG. 21 is a cross-section of a nMOS transistor in an example to which the first embodiment of the present invention is applied.

As an example of the first embodiment, a nMOS transistor on a p-type semiconductor substrate 101 shown in FIG. 21 will be described. This nMOS transistor also, as the semiconductor device shown in the first embodiment, comprises a A-type-film 102, a B-type-film 103 as interlayer dielectric film and a contact hole 104. The nMOS transistor is sandwiched by a field oxide film 110 and comprises an n+source area 106, an n+drain area 107, and a silicide layer 105 formed on a top 109 of the p-type semiconductor substrate 101, and a gate electrode 100 formed over the p-type semiconductor substrate 101. Moreover, the A-type-film 102, the B-type-film 102 as interlayer dielectric film and the contact hole 104 are formed on the nMOS transistor. It is via this contact hole 104 (not shown) that aluminum wiring or the like are connected electrically. This aluminum wiring is connected to an external electrode terminal of the other MOS transistor or of this nMOS transistor. Moreover, the conduction type of the semiconductor substrate may be type n. However, in such case, the conduction type of the source area 106 and the drain area 107 should be type p.

In the substrate 101 under the contact hole 104, the silicide layer 105 for lowering the contact resistance reaches to the depth of 30 nm from the substrate top 109, and a pn junction interface 108 exists at the depth of 100 nm form the substrate top 109. The maximum substrate etching depth estimated in the first embodiment can also be applied to this example, and being 22 nm, it will not exceed 30 nm increasing the contact resistance and hampering the transistor operation, and further, will not exceed 100 nm to destroy the transistor.

(Second Embodiment)

As a second embodiment, the semiconductor device manufacturing method according to the present invention will be described taking an example of processing flow of a semiconductor device including a leveled C-type-film as interlayer dielectric film, and a C-type-film deposited thereon, as show in FIG. 22. The flow chart of the semiconductor device manufacturing method according to the present invention follows the flow chart diagram of FIG. 6, FIG. 10 and FIG. 12.

(a) First, in the step S1 of FIG. 6, a processing flow is created wherein manufacturing process names and metrology process names are arranged in the manufacturing order. This processing flow comprises a step S51 for depositing a C-type-film in a first deposition process shown in FIG. 22, a step S53 for polishing the C-type-film in a polishing process, a step S54 for measuring the thickness of the C-type-film in a polishing process, and at last, a step S55 for depositing the C-type-film by a second deposition process.

(b) Next, the step S2 of FIG. 6 is performed, or more in detail, the processing shown in FIG. 10 is performed. In the step S11 of FIG. 10, the first deposition process (step S51 in FIG. 22), process name, is extracted from the processing flow. In the step 12 of FIG. 10, it is determined if the processing conditions in the first deposition process can be linked with the results of previous metrology process. As the linkage is impossible, in the step S14 of FIG. 10, the film type is set to C and the thickness within 1000 nm +/−10% as processing conditions independent of metrology results. In the step S15 of FIG. 10, it is determined if all processes are extracted. As all are not extracted, it returns to the step 11 to extract the polishing process. Thereafter, similarly to the first deposition process, the remaining thickness is set to within 500 nm +/−10%. In the step S15 of FIG. 10, it is determined if all processes are extracted. As all are not extracted, it returns to the step 11 to extract the second deposition process. In the step 12 of FIG. 10, it is determined if the processing conditions in the second deposition process can be linked with the results of previous metrology process. As they can be linked, in the step S13 of FIG. 10, the film thickness, processing condition described as function of the thickness data, previous metrology process name, is set as process condition of the second deposition process. This thickness can be expressed by the formula (3).

(Thickness)=1000 nm−(metrology process)     (3)

Figure 22:
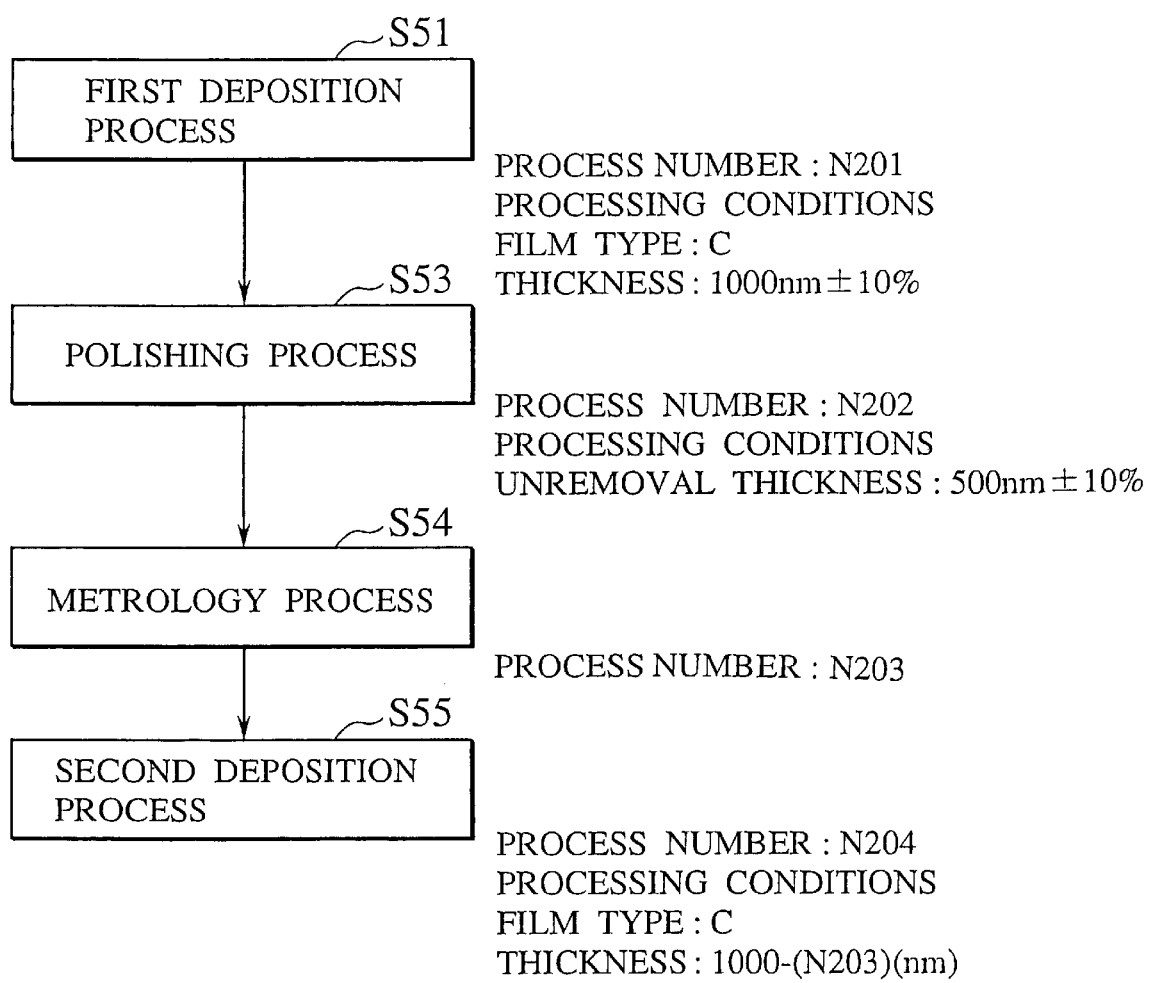
FIG. 22 shows a processing flow in a second embodiment of the present invention.

In the step S16 of FIG. 10, a process number N201 is added to the first deposition process, process name (step S51 of FIG. 22), N202 to the polishing process (step S53 of FIG. 22), N204 to the second deposition process (step S55 of FIG. 22) and N203 to the metrology process (step S55 of FIG. 22). In the step S17, the thickness is set as function of the process number N203. This thickness is expressed by the formula (4).

(Thickness)=1000 nm−N203     (4)

In the step 15, it is determined if all processes are extracted. As all are extracted, the step S2 terminates.

FIG. 23 shows a data structure added to the processing flow. Process number is stored in a data area 40, process name and metrology process name are stored in a data area 41, while processing conditions are stored in a data area 42 for each process. The thickness, processing condition of the deposition process is described by the function 47 of the process number N203.

Figure 3:
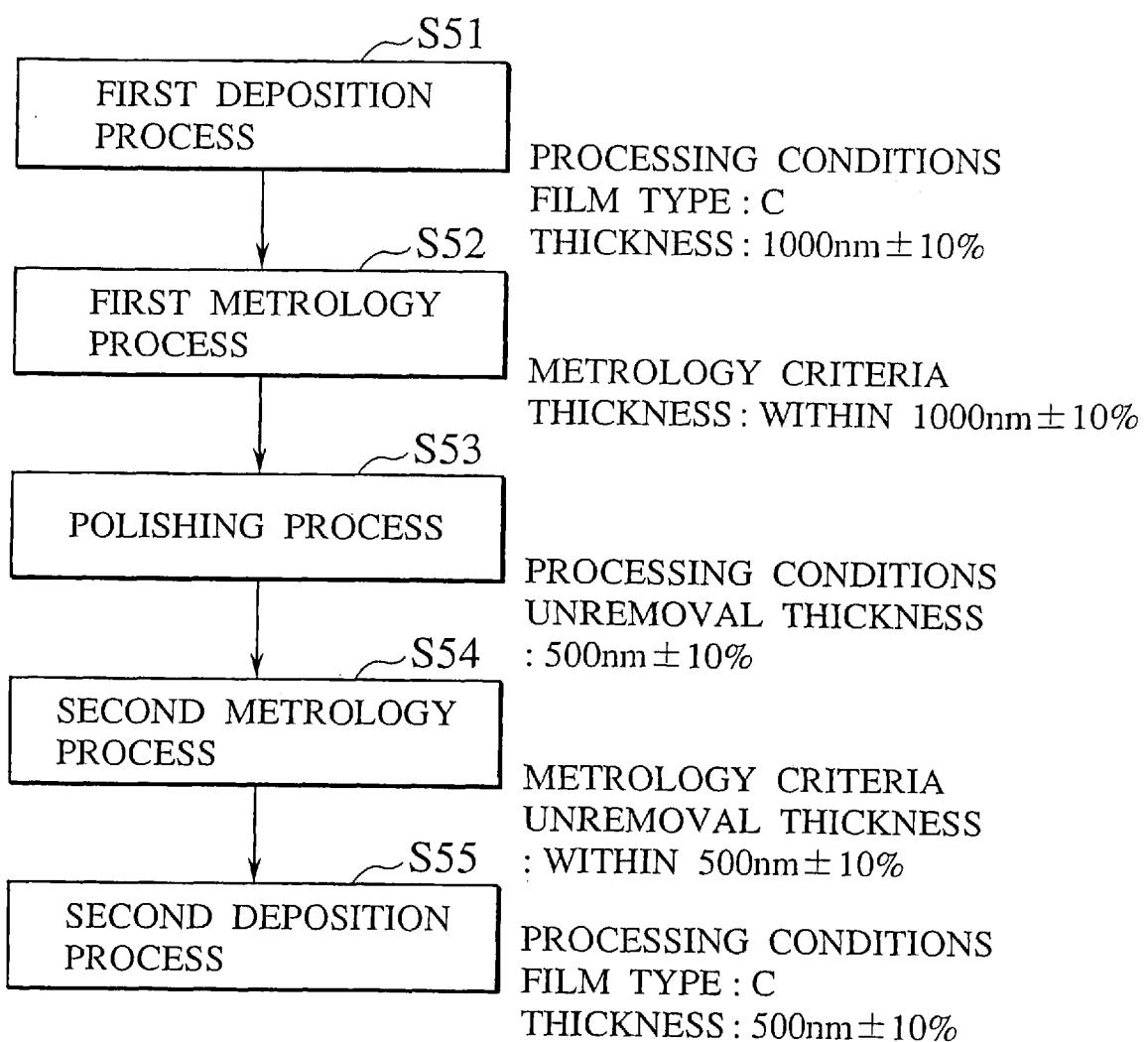
FIG. 3 shows a processing flow in a conventional example 2.
Figure 4A:
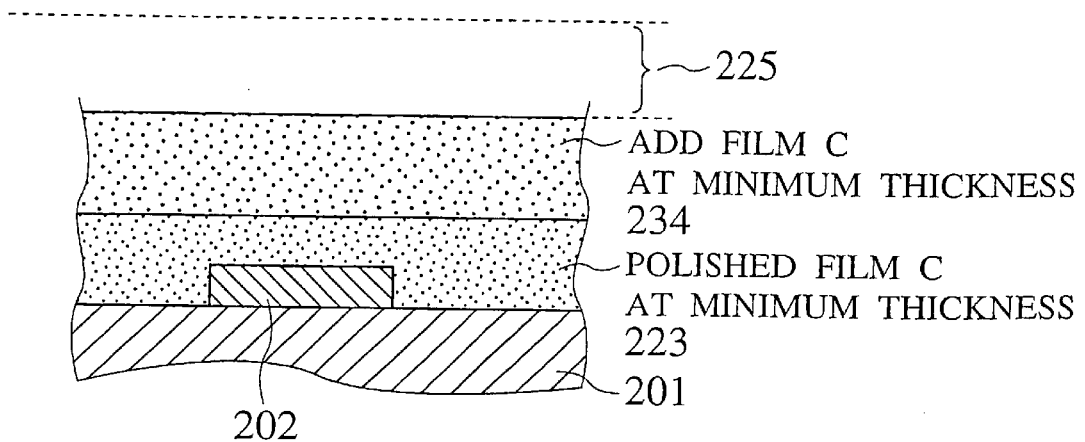
FIG. 4A and FIG. 4B are cross sections of the cases where the film thickness becomes minimum and maximum.
Figure 4B:
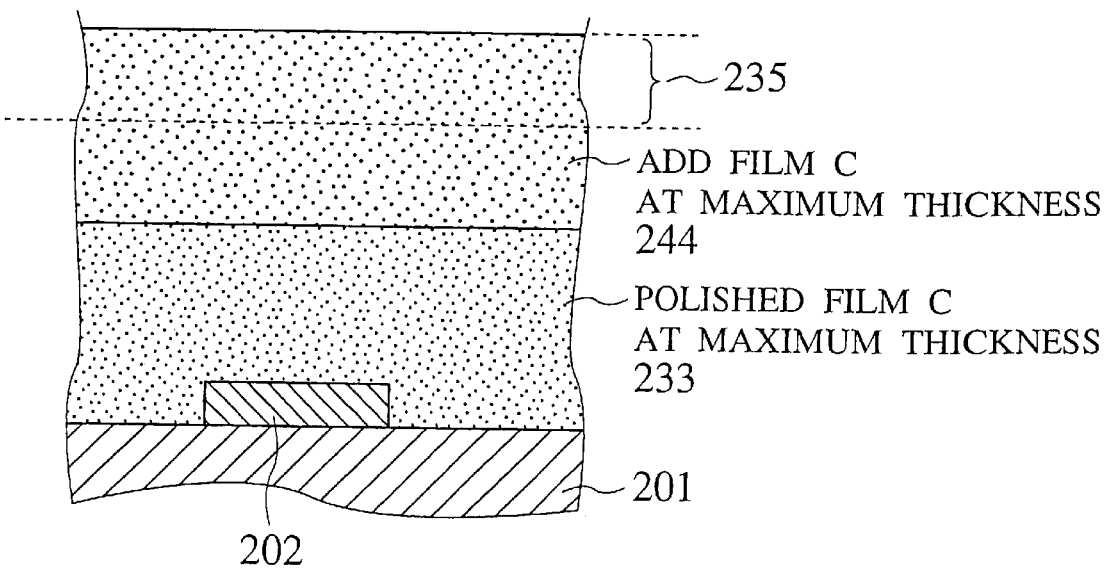

(c) Next, the processing of the step S3 of FIG. 3 and thereafter are performed, accompanying a sequence of processes for an actual semiconductor device manufacturing. FIG. 24A to FIG. 24D shows the cross-section of semiconductor devices in the course of manufacturing. First, in FIG. 24A, a protrusion 202 of wiring or the like is formed on the substrate 201.

Figure 24A:
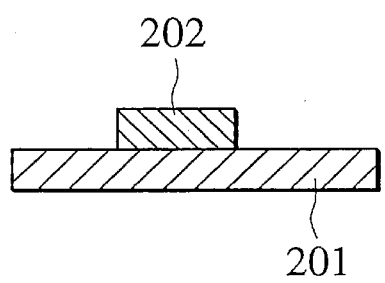
FIG. 24A to FIG. 24D are cross-sections illustrating the manufacturing method of the semiconductor device manufacturing method according to the second embodiment of the present invention.
Figure 24B:
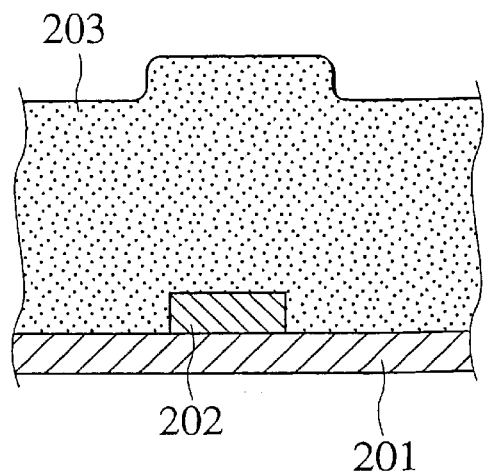
Figure 24C:
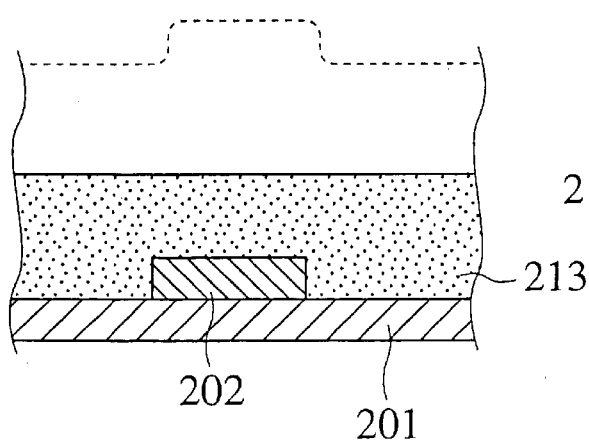
Figure 24D:
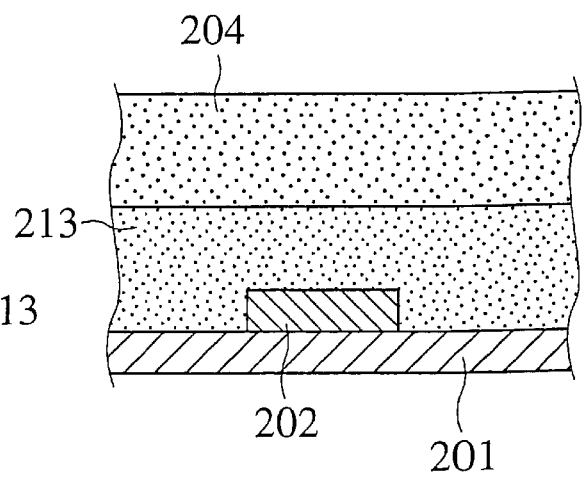

Next, in a step 31 of FIG. 12 (inner flow of the step S3), the first deposition process of the step S51 of FIG. 22. In a step S34 of FIG. 12, it is determined if the first deposition process processing condition is described as function of the process number. As this is not described as function and as processing condition of the first deposition process consists in depositing the C-type-film 203 (for example, PE-TEOS film) with a thickness of 1000 nm, the step 3 of FIG. 6 terminates. In the step S4 of FIG. 6, processing parameters such as deposition time or flow rate of source gases are calculated from the processing conditions. In the step S5 of FIG. 6, the C-type-film 203 is deposited by a CVD furnace 73 using processing parameters such as deposition time or others as shown in FIG. 24B. Note that the following thickness measurement, step S6 of FIG. 6, may be omitted in the present invention. Because, the measured thickness after the first deposition process is not used for setting the processing conditions of the second deposition process. In the step 7 of FIG. 6, it is determined if the processing flow has terminated. As the processing flow is not terminated, it returns to the step 3 of FIG. 6. The step S3 of FIG. 6 starts, and the polishing process is extracted in the step S31 of FIG. 12. In the step 34 of FIG. 12, it is determined if processing conditions of the polishing process of the step S53 of FIG. 22 is described as function of process number. If it is not so described, the step S3 of FIG. 6 terminates. The processing condition of the polishing process consists in polishing the remaining thickness to 500 nm. In the step S4 of FIG. 6, processing parameters, such as polishing time, abrasive agent flow rate, or the like are calculated. The C-type-film 203 is polished to leave a C-type-film 213 as shown in FIG. 24C.

(d) Further, in the step S6 of FIG. 6, the thickness is measured by the thickness measurement of the step S54 shown in FIG. 22. In the step S7 of FIG. 6, it is determined if the processing flow has terminated. If the processing flow is not terminated, it returns to the step S3 of FIG. 6, and in the step S31 of FIG. 12, it is extracted the processing conditions of the second deposition process of the step S55 of FIG. 22. In the step S34 of FIG. 12, it is determined if these processing conditions are described as function of process number. If it is described as function of the process number N203, in the step S35 of FIG. 12, the metrology results are obtained from the metrology process of the step S54 to which the process number N203 is added. In the step S23 of FIG. 12, the metrology result of the thickness metrology process and the processing condition of the second deposition process are linked to generate new processing conditions according to the measurement results. To be more specific, the thickness, the result of the thickness metrology process, is substituted in the function of thickness of the second deposition process. In the step S4 of FIG. 6, processing parameters, such as deposition time or flow rate of source gases, are calculated from the thickness, processing condition. In the step 5 of FIG. 6, a C-type-film 204 is deposited by executing the step S55 of FIG. 22 with a CVD furnace 73 using deposition time or the like. In the step S7 of FIG. 6, it is determined if the processing flow has terminated. If the processing flow has terminated, the flow of FIG. 6 also terminates.

Figure 25A:
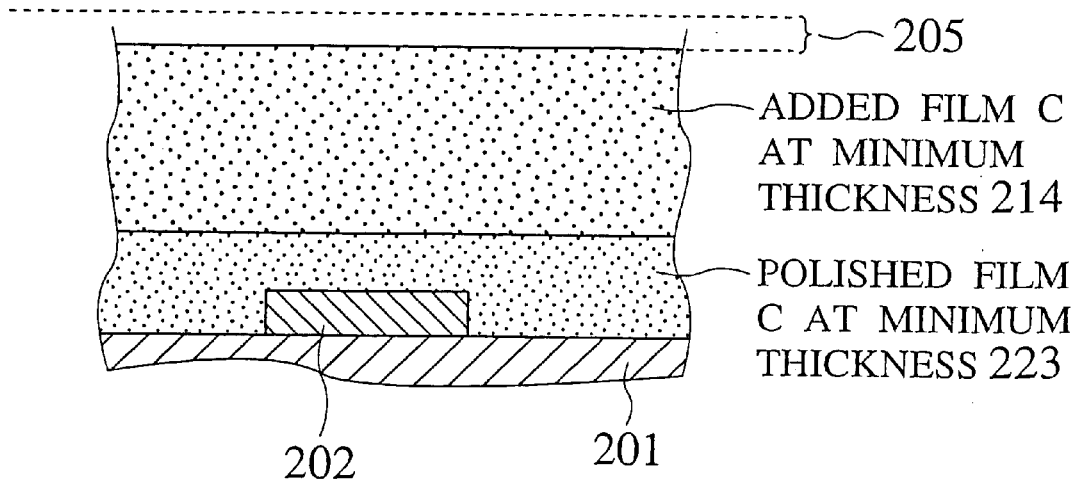
FIG. 25A and FIG, 25B are cross-sections of a semiconductor device in the case where the film thickness of the second embodiment of the present invention becomes minimum and maximum.
Figure 25B:
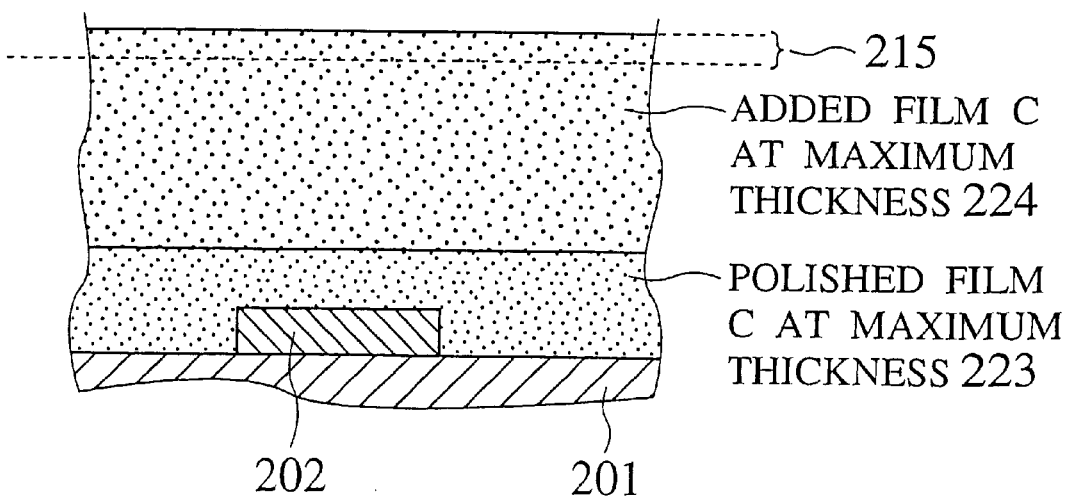

Here, the minimum value and the maximum value of the thickness of the interlayer dielectric film after the second deposition process will be determined supposing the controllable processing range of a manufacturing equipment be ±10%. The situation in which the minimum value will be obtained is shown in FIG. 25A. The minimum value is 935 nm, the difference 205 from the designed thickness 1000 nm being 65 nm. The minimum value is obtained when a C-type-film 223 of minimum thickness is deposited to 900 nm in the first deposition process, the C-type-film 223 is polished maximally by 550 nm in the polishing process, and the minimum 585 nm is deposited, in respect to the objective thickness 650 nm, in the second deposition process. The situation in which the maximum value will be obtained is shown in FIG. 25B. The maximum value is 1065 nm, the difference 215 from the designed thickness 1000 nm being 65 nm. The maximum value is obtained when the film is deposited to 900 nm in the first deposition process, the film is polished by 550 nm in the polishing process, and the film having maximum thickness of 715 nm is deposited, in respect to the objective thickness of 650 nm, in the second deposition process. The designed central value of the thickness of the interlayer dielectric film after the second deposition process being 1000 nm, a dispersion of ±6.5% will be generated. The important point is that the resulting thickness of the interlayer dielectric film will be limited to ±6.5%, even when the thickness is controlled with ±10% in each process. It is understood that this value is reduced to about one third compared to the second conventional example. Thus, miniaturized semiconductor devices can be fabricated with an extraordinary precision without restricting the control range of the manufacturing equipment. Moreover, the number of metrology process in the processing flow can be reduced.

(Other Embodiments)

Hereinabove, the present invention has been described about its first and second embodiments, it should not be understood that the description and drawings, part of this disclosure, define the present invention. Those skilled in the art may conceive a variety of alternative embodiments, examples and application technology without departing from this disclosure.

Though only the thickness has been illustrated as for metrology articles in the explanation of the aforementioned first and second embodiments, it may well be the measurement uniformity of the thickness in the wafer face.

Moreover, it can be applied to the method for manufacturing semiconductor devices, in general. For instance, it is the feature sizes of the transistor and impurity concentrations contained in the semiconductor which compose the transistor that determine the transistor performance, and the feature sizes of transistors are not defined by the dimensions in the thickness direction, or film thickness and plane dimensions; however, the present invention can be applied not only to the film thickness but also to the impurity concentration and the plane dimensions.

As for the impurity concentration, for instance, the $h_{FE}$ (current amplification factor) of npn bipolar transistor varies according to the variation of base impurity concentration and emitter impurity concentration. There, according to the present invention, even when there is a dispersion in the implanted dose amount of impurity ions for forming the base area, the dose amount may be compensated during the implantation of impurity ions for forming the emitter area, by measuring the dose amount of the former. The dispersion of $h_{FE}$ can be limited by implanting the impurity ions to the emitter area with such compensated dose amount.

In the manufacturing of LSI, in order to construct a minute planer structure, a number of photo-lithography processes are repeated to align multi-layer masks respectively. The heat treatment process performed during this photo-lithography process induces the dispersion by distorting the wafer, and in the following photo-lithography, the mask alignment may become impossible. In this case, according to the present invention, the dimensions of wafer distortion are measured after the heat treatment, and in the following photo-lithography, the mask can be exposed to the light all the way compensating by its.

Various modifications will become possible for those skilled in the art after receiving the teachings of the present disclosure without departing from the scope thereof.

What is claimed is:

1. A method of manufacturing a semiconductor device, the method comprising:

generating a processing flow arranging a sequence of a metrology process name of a metrology process in measuring the semiconductor device and a manufacturing process name of a manufacturing process of the semiconductor device worked after the metrology process in a manufacturing order;

adding a data label to the metrology process name;

generating a processing condition of the manufacturing process described by a formula as a function of the data label;

obtaining a metrology result of the metrology process of the semiconductor device;

generating a new processing condition of the manufacturing process peculiar to the semiconductor device by substituting the metrology result for the data label of the function; and manufacturing the semiconductor device under the new processing condition.

2. The method of claim 1, further comprising:

calculating a processing parameter to be input into a manufacturing equipment manufacturing the semiconductor device, on the new processing condition.

3. The method of claim 1, wherein said generating the new processing condition includes:

detecting the data label by the metrology result; and retrieving the processing condition from the processing flow by the data label.

4. The method of claim 1, wherein said generating the new processing condition includes:

extracting the processing condition from the processing flow in the manufacturing order;

detecting the data label from the processing condition; and acquiring the metrology result of the semiconductor device of the metrology process name added the data label.

5. A semiconductor device manufacturing support system for manufacturing a semiconductor device on a processing flow arranging a sequence of a metrology process name of a metrology process in measuring the semiconductor device and a manufacturing process name of a manufacturing process of the semiconductor device worked after the metrology process in a manufacturing order, and being able to obtain a metrology result of the metrology process of the semiconductor device, the system comprising:

a link data setting unit configured to add a data label to the metrology process name and configured to generate a processing condition of the manufacturing process described by a formula as a function of the data label; and a processing condition generation unit configured to generate a new processing condition of the manufacturing process peculiar to the semiconductor device by substituting the metrology result for the data label of the function.

6. The system of claim 5, further comprising:

a processing parameter calculation unit configured to calculate a processing parameter to be input into a manufacturing equipment manufacturing the semiconductor device, on the new processing condition.

7. The system of claim 5, wherein said processing condition generation unit detects the data label by the metrology result and retrieves the processing condition from the processing flow by the data label.

8. The system of claim 5, wherein said processing condition generation unit extracts the processing condition from the processing flow in the manufacturing order, detects the data label from the processing condition, and acquires the metrology result of the semiconductor device of the metrology process name added the data label.

9. A system for manufacturing a semiconductor device on a processing flow arranging a sequence of a metrology process name of a metrology process in measuring the semiconductor device and a manufacturing process name of a manufacturing process of the semiconductor device worked after the metrology process in a manufacturing order, the system comprising:

a link data setting unit configured to add a data label to the metrology process name and configured to generate a processing condition of the manufacturing process described by a formula as a function of the data label;

a measurement device group configured to obtain a metrology result of the metrology process of the semiconductor device;

a processing condition generation unit configured to generate a new processing condition of the manufacturing process peculiar to the semiconductor device by substituting the metrology result for the data label of the function;

a processing parameter calculation unit configured to calculate a processing parameter to be input into a manufacturing equipment manufacturing the semiconductor device, on the new processing condition, and a manufacturing equipment group configured to manufacture the semiconductor device under the processing parameter.

10. The system of claim 9, wherein said processing condition generation unit detects the data label by the metrology result and retrieves the processing condition from the processing flow by the data label.

11. The system of claim 9, wherein said processing condition generation unit extracts the processing condition from the processing flow in the manufacturing order, detects the data label from the processing condition, and acquires the metrology result of the semiconductor device of the metrology process name added the data label.

12. A computer program product of a computer being able to obtain a metrology result of a metrology process of a semiconductor device for supporting to manufacture the semiconductor device on a processing flow arranging a sequence of a metrology process name of the metrology process and a manufacturing process name of a manufacturing process of the semiconductor device worked after the metrology process in a manufacturing order, the computer program product comprising:

computer-executable code for adding a data label to the metrology process name;

computer-executable code for generating a processing condition of the manufacturing process described by a formula as a function of the data label; and computer-executable code for generating a new processing condition of the manufacturing process peculiar to the semiconductor device by substituting the metrology result for the data label of the function.

13. The computer program product of claim 12, further comprising:

computer-executable code for calculating a processing parameter to be input into a manufacturing equipment manufacturing the semiconductor device, on the new processing condition.

14. The computer program product of claim 12, said computer-executable code for generating the new processing condition includes:

computer-executable code for detecting the data label by the metrology result; and computer-executable code for retrieving the processing condition from the processing flow by the data label.

15. The computer program product of claim 12, wherein said computer-executable code for generating the new processing condition includes:

computer-executable code for extracting the processing condition from the processing flow in the manufacturing order;

computer-executable code for detecting the data label from the processing condition; and computer-executable code for acquiring the metrology result of the semiconductor device of the metrology process name added the data label.

16. A computer readable recording medium for storing a program of a computer being able to obtain a metrology result of a metrology process of a semiconductor device for supporting to manufacture the semiconductor device on a processing flow arranging a sequence of a metrology process name of the metrology process and a manufacturing process name of a manufacturing process of the semiconductor device worked after the metrology process in a manufacturing order, the program including code for executing a method comprising:

adding a data label to the metrology process name;

generating a processing condition of the manufacturing process described by a formula as a function of the data label; and generating a new processing condition of the manufacturing process peculiar to the semiconductor device by substituting the metrology result for the data label of the function.

17. The computer readable recording medium of claim 16, wherein the program for supporting to manufacture the semiconductor device includes code for executing a step of calculating a processing parameter to be input into a manufacturing equipment manufacturing the semiconductor device, on the new processing condition.

18. The computer readable recording medium of claim 16, wherein said generating the new processing condition of the program for supporting to manufacture the semiconductor device includes:

detecting the data label by the metrology result; and retrieving the processing condition from the processing flow by the data label.

19. The computer readable recording medium of claim 16, wherein said generating the new processing condition of the program for supporting to manufacture the semiconductor device includes:

extracting the processing condition from the processing flow in the manufacturing order;

detecting the data label from the processing condition; and acquiring the metrology result of the semiconductor device of the metrology process name added the data label.

20. A computer readable recording medium for storing data for a computer supporting to manufacture the semiconductor device on a processing flow arranging a sequence of a metrology process name of the metrology process and a manufacturing process name of a manufacturing process of the semiconductor device worked after the metrology process in a manufacturing order, the computer readable medium comprising:

a data area configured to store the manufacturing process name and the metrology process name in a manufacturing order;

a data label corresponding to the metrology process name; and a processing condition of the manufacturing process corresponding to the manufacturing process name, described by a formula as a function of the data label.

* * * * *